US008530120B2

(12) United States Patent
Wahlsten et al.

(10) Patent No.: US 8,530,120 B2
(45) Date of Patent: Sep. 10, 2013

(54) METHOD AND APPARATUS FOR PERFORMING PATTERN RECONNECTION AFTER INDIVIDUAL OR MULTIPART ALIGNMENT

(75) Inventors: Mikael Wahlsten, Stockholm (SE); Per-Erik Gustafsson, Solna (SE)

(73) Assignee: Micronic Mydata AB, Taby (SE)

( * ) Notice: Subject to any disclaimer, the term of this patent is extended or adjusted under 35 U.S.C. 154(b) by 70 days.

(21) Appl. No.: 12/929,981

(22) Filed: Feb. 28, 2011

(65) Prior Publication Data

US 2011/0257777 A1 Oct. 20, 2011

Related U.S. Application Data

(60) Provisional application No. 61/282,547, filed on Feb. 26, 2010, provisional application No. 61/282,561, filed on Mar. 1, 2010, provisional application No. 61/323,047, filed on Apr. 12, 2010, provisional application No. 61/323,048, filed on Apr. 12, 2010, provisional application No. 61/323,685, filed on Apr. 13, 2010.

(51) Int. Cl.
*G03F 9/00* (2006.01)
*G03C 5/00* (2006.01)

(52) U.S. Cl.
USPC .................. 430/22; 430/30; 430/311; 355/53

(58) Field of Classification Search
USPC ................................ 430/22, 30, 311; 355/53
See application file for complete search history.

(56) References Cited

U.S. PATENT DOCUMENTS

| 6,165,658 | A | 12/2000 | Taff et al. |
| 7,508,515 | B2 | 3/2009 | Hanina et al. |
| 2003/0086600 | A1 | 5/2003 | Ganot et al. |
| 2003/0124868 | A1 | 7/2003 | Mizukoshi |
| 2005/0213806 | A1 | 9/2005 | Hanina et al. |
| 2006/0033902 | A1 | 2/2006 | Latypov et al. |
| 2007/0026174 | A1 | 2/2007 | Labbe et al. |

FOREIGN PATENT DOCUMENTS

| WO | WO-03094582 A2 | 11/2003 |
| WO | WO 2004/109760 | 12/2004 |
| WO | WO 2006/079865 | 8/2006 |
| WO | WO 2010/049924 | 5/2010 |

OTHER PUBLICATIONS

International Search Report and Written Opinion mailed Jun. 6, 2011 for International Application No. PCT/EP2011/052867.

*Primary Examiner* — Christopher Young
(74) *Attorney, Agent, or Firm* — Harness, Dickey & Pierce, PLC

(57) ABSTRACT

A method for patterning a second layer of a work piece in a direct write machine in the manufacturing of a multilayer system-in-package stack. The work piece having a first layer with a plurality of electrical components in the form of dies arbitrarily placed. Each component having connection points where some need to be connected between the components. A first pattern wherein different zones comprising connection points of dies distributed in the first layer are associated with different requirements on alignment. The method comprising the steps of: a. Detecting sacred zones in first pattern that have a high requirement on alignment to selected features of the system-in-package stack or to the placed components; b. Detecting stretch zones of the first pattern that are allowed to have a lower requirement on alignment to other features of the system-in-package stack; c. Transforming the first pattern by calculating adjusted first pattern data comprising transformation of the original circuit pattern such that: i. connection points in adjacent sacred zones are aligned within a presettable alignment deviation parameter; and such that ii. deviations between the positions of corresponding connection points in the sacred zones are compensated for in the pattern for connection points of the stretch zones; d. writing a pattern on the layer of the work piece according to the adjusted pattern data. The first pattern may also be simultaneously matched to a second pattern.

63 Claims, 28 Drawing Sheets

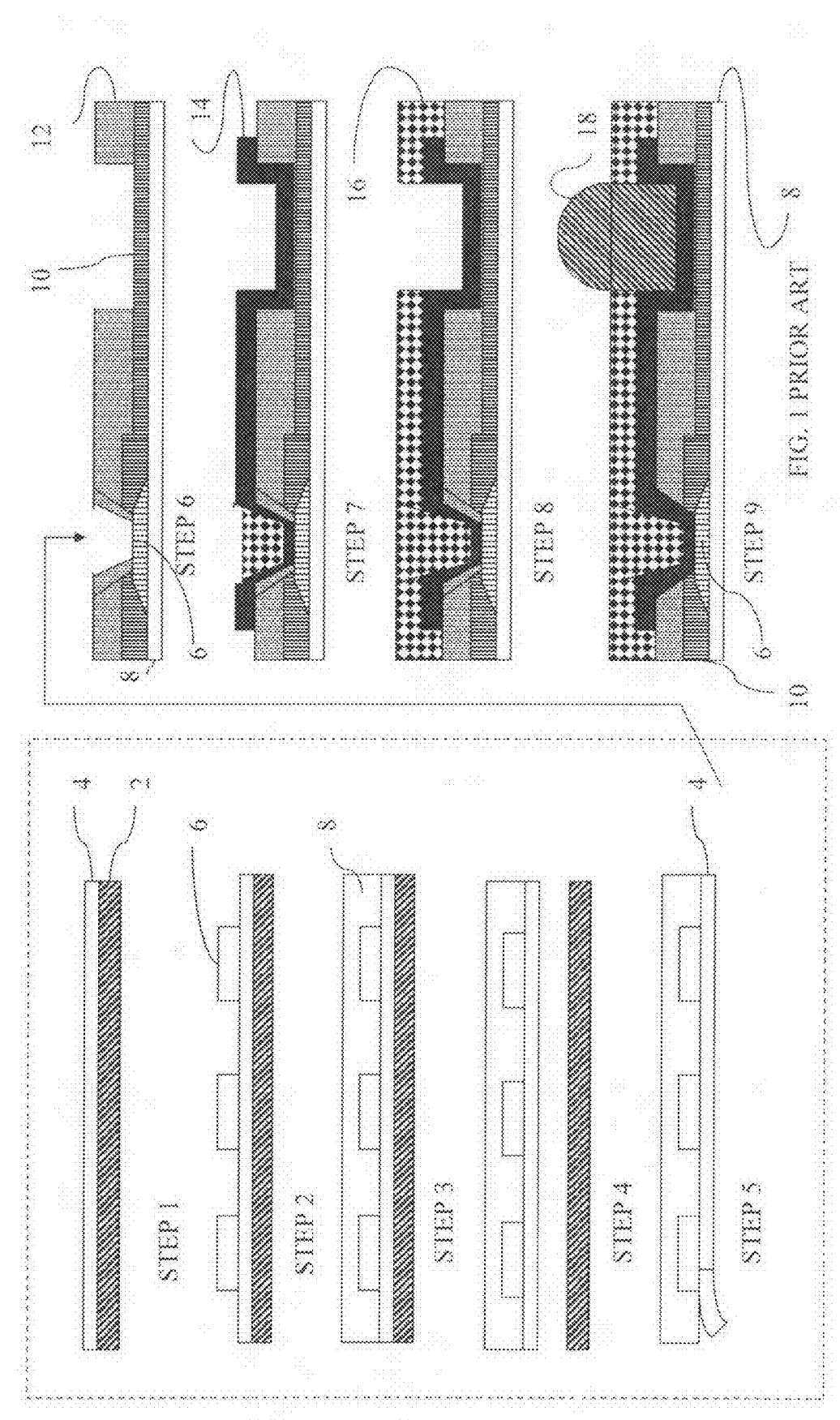

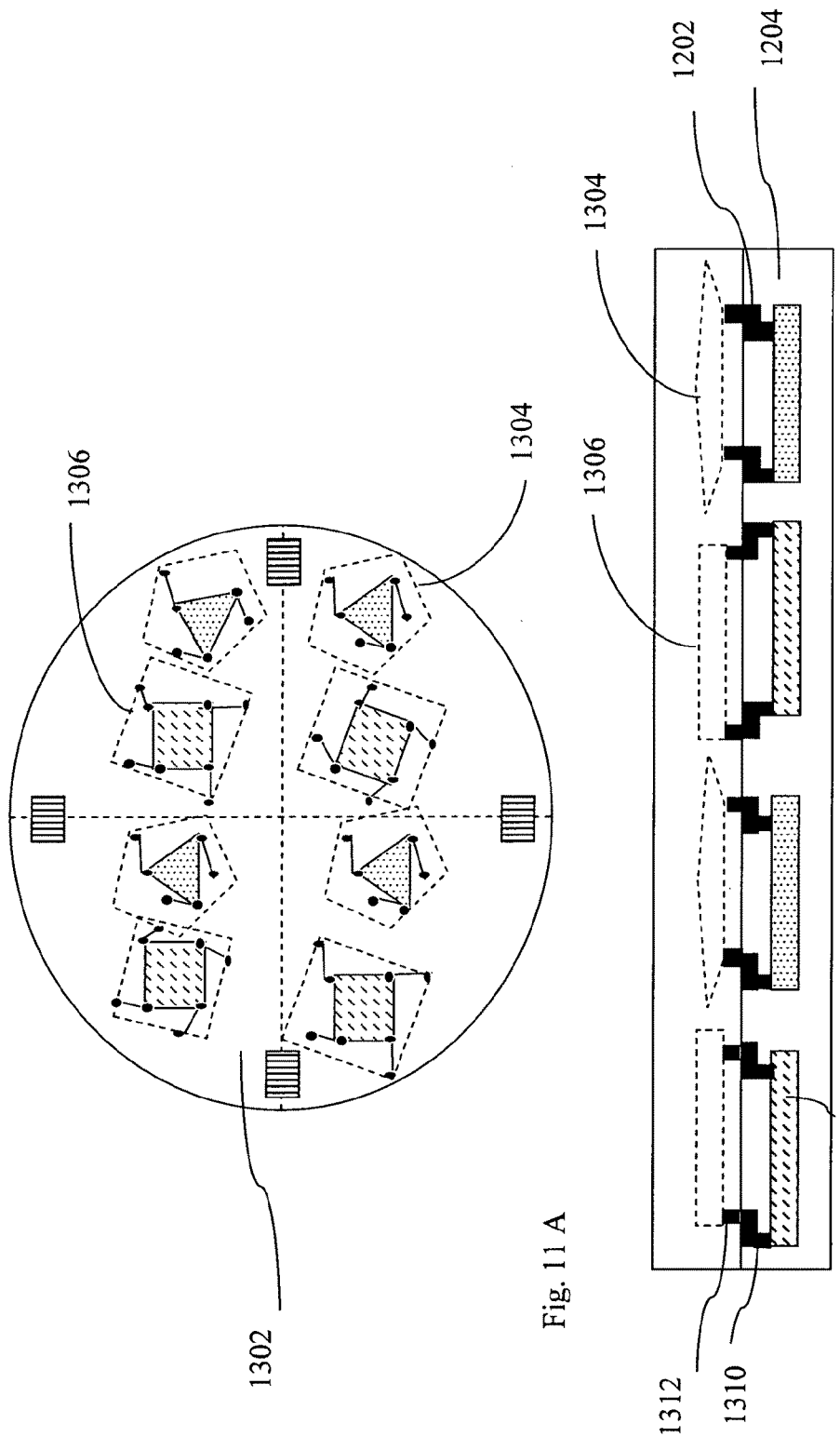

METHOD AND APPARATUS FOR PERFORMING PATTERN RECONNECTION AFTER INDIVIDUAL OR MULTIPART ALIGNMENT

CROSS-REFERENCE TO RELATED APPLICATIONS

This non-provisional U.S. patent application claims priority under 35 U.S.C. §119(e) to provisional U.S. patent application No. 61/282,561, filed on Mar. 1, 2010, provisional U.S. patent application No. 61/282,547, filed on Feb. 26, 2010, provisional U.S. patent application No. 61/323,047, filed on Apr. 12, 2010, provisional U.S. patent application No. 61/323,048, filed on Apr. 12, 2010, and provisional U.S. patent application No. 61/323,685, filed on Apr. 13, 2010, the entire contents of all of which are incorporated herein by reference.

TECHNICAL FIELD OF THE INVENTION

The present invention relates in general to laser pattern imaging of workpieces in the manufacturing of products comprising patterning of a photosensitive surface employing a laser direct imaging device. More particularly, the present invention relates to methods and apparatuses for performing pattern reconnection after alignment of pattern to individual or multiple components such as dies.

GENERAL BACKGROUND OF THE INVENTION

It is common practice to manufacture printed circuit boards in a method to build a sequence of layers having different electric circuit patterns. For this purpose pattern generators using a laser direct writer as an imaging device for writing an electric circuit pattern on a substrate are well known.

For example in the manufacturing of printed circuit boards with integrated circuits, a plurality of dies in the form of small blocks of semiconducting material each having a functional electronic circuit are distributed on a printed circuit board workpiece e.g. in the form of a carrier silicon wafer. The dies are then covered with further layers of material to form the integrated circuit in a series of manufacturing steps. In the course of the manufacturing process patterns are generated on selected layers of the workpiece in one or a plurality of patterning steps.

Pattern Generation

Patterns are generated on a layer of a workpiece, for example for the purpose of forming an electric circuit pattern generated in order to couple connection points or contact pads of components such as dies in a desired electric circuit. The expression die is herein used as common expression for any electronic component such as a passive component, an active component, or any other component associated with electronics. Such a pattern is generated in a writing or printing process in which an image of a circuit pattern is projected, written printed on a surface layer covering a conductive layer on the workpiece.

In this context writing and printing are to be understood in a broad sense. For example, projecting, writing or printing a pattern on a surface may include exposing a photoresist or other photosensitive material, annealing by optical heating, ablating, creating any other change to the surface by an optical beam, etc.

Dependent on the used kind of photosensitive surface material, unexposed or exposed parts of the photosensitive surface layer are removed to form etching masks on the workpiece. The masked workpiece is then etched to form the desired electrical circuit pattern on the conductive layer. A variation of this concept is to use the pattern to deposit material onto the underlying layer, e.g. to form an electrical circuit pattern or connection points on the workpiece.

Pattern Generator

The pattern generator is for example realized by means of a laser direct imaging (LDI) system devised for writing a pattern on the photosensitive surface by means of a laser scanning the surface with a laser beam that is modulated according to image pattern data and forming an image representing a desired electrical circuit pattern.

SPECIFIC BACKGROUND OF THE INVENTION

In recent development of manufacturing methods in this field the interest for embedded dies technologies and wafer level packaging technologies has increased due to expected advantages in cost and performance. Although these are referred to as different technologies they both involve the embedding of dies and related problems.

In this development of manufacturing integrated circuits and other products involving patterning of layers there are however various factors that affect the productivity. The placing of dies and alignment of patterns are important factors that are decisive for the overall yield in the manufacturing process using these technologies. For example, in wafer level packaging the fan-out process comprise stages that are limiting to productivity.

Alignment and Overlay Control

The printed patterns must be aligned to certain features of the workpiece, for example to the dies in order to fit to connection points in the functional electronic circuit of the respective die or to other patterns in the same or different layers of the workpiece. Overlay control is a term describing the monitoring and control of pattern-to-pattern alignment on multilayer structures.

In prior art, measuring systems comprising imagers e.g. CCD cameras, are commonly used in such alignment procedures for determining the position of a workpiece and selected features on the workpiece. For example, the cameras are employed to detect features of the workpiece such as edges or markings on the workpiece, the positions of the features in the images are used to calculate the real physical positions in relation to a reference in the pattern generator. There are different ways to compensate for the deviations of the real physical conditions from the ideal physical conditions upon which the originally designed image pattern data is assumed. For example, the image pattern data is adjusted and then the pattern is written dependent on the adjusted image pattern data. In another example, the coordinate system of the writer is adjusted to compensate and the original pattern data is written in an adjusted coordinate system.

Placing of Dies on Workpiece

Prior art patterning systems require workpieces with dies placed very accurately on the workpiece to be able to align patterns to the dies. This is due to the fact that prior art patterning systems use steppers and aligners that have limited capabilities to perform alignment to individual dies without significantly slowing down the patterning process with the consequence that current requirements on the takt time that sets the pace for the process of manufacturing products comprising patterned layers cannot be met. In prior art, the dies are accurately placed on the workpiece and fastening the dies by eutectic bonding or glue onto the workpiece, which is a very time consuming process.

Placing of Dies on Workpiece by Pick-and-Place Machine

There is a desire in the industry to distribute the dies on the workpiece by means of a pick and place machine in order to increase the production rate. However, present day pick-and-place machines cannot keep the speed required by the takt time of the manufacturing process, while maintaining the placement accuracy that is required by prior art pattern generators to manage alignment. Dies placed by means of pick-and-place machines can be regarded to have random positional errors.

Fan Out Process

The fan out process is an example of a process that includes arranging conductive paths for connecting to connection points of dies on a workpiece. A redistribution layer covering the dies is provided with a circuit pattern that is aligned with the dies and connected to contact pads e.g. with solder balls deposited on the redistribution layer and extending to an another layer in a vertical electrical connection by an aperture that in short is called a via, for vertical interconnect access between conductors in different layers. Typically, the connection points or the connection lines are spread over a larger surface area in to enable a higher ball grid pitch. Alignment between layers is an important factor in the fan-out process and prior art conventional fan-out processes for inaccurately placed dies are not cost effective due to the poor performance of alignment to individual dies in prior art patterning systems. FIG. 1 shows schematically an example of embedded dies in a prior art process description of a fan-out wafer level packaging process. This process is further described in the detailed description below.

PRIOR ART

Examples of prior art pattern generators and alignment are found in the patent publications US 2003/0086600 Multilayer Printed Circuit Board Fabrication System and Method; WO 03/094582 and related US2005/0213806 (A1) A System and Method for Manufacturing Printed Circuit Boards Employing Non-uniformly Modified Images.

These pieces of prior art describe the general functionality of pattern generators in the form of laser direct imaging systems adapted to write an electric circuit pattern on a printed circuit board dependent on pattern image data. These publications further describe prior art for alignment of patterns on substrates.

Difficulties in Prior Art

FIG. 2 shows an example of dies 202 placed on a workpiece in the form of a wafer 200 in a general order on a global level but in a non-systematic order on a local level. In summary, in order to increase production rate die placement must be allowed to be less accurate and even non-systematic as in FIG. 2. However, random positional errors for a die make it relatively difficult to achieve desired overlay performance with conventional aligners. In prior art, EGA alignment (Enhanced Global Alignment) capability allows conventional stepper technology to increase exposure rate in packaging of devices with relatively tight design rules. In this case such steppers expose the same transform of pattern for several dies in the assumption that they fit to the same transform. Alternatively, the same pattern is exposed for such a low number of dies that the probability of excessively large deviations from specification is avoided.

FIG. 3 shows a conventional prior art printing method that seeks to deal with the local alignment problem, here aligning to individual dies 300 in a group of two dies. As shown in FIG. 3, the exposure regions are divided into small areas down to each die. In A. 1×1 field with 2 drop-in die which in this example requires 390 exposure shots/wafer; in B. 2×2 filed overprinting at edge and requiring 103 shots/wafer; and in C. 5×3 field overprinting at edge 34 shots/wafer. The exposure is in this prior art method performed by steppers. However, this conventional approach has a relatively large takt penalty because realigning for each shot is necessary.

Examples of prior art describing alignment between different layers are inter alia shown in the patent publications: WO2010049924(A1) to Orbotech, U.S. Pat. No. 7,508,515 (B2) and WO2004109760(A2) to Sony show examples of transformation of pattern of subsequent layer to actual pattern of previous layer, e.g. transforming contact pads. However, this piece of prior art lacks disclosure of application in stack with dies and solutions addressing specific problems in this application.

In the fan-out process or similar processes, such as embedded die process, where a number of connection lines from two or more dies are to be connected there may still be problems after alignment of the pattern to the dies. FIG. 12 illustrates connection lines 1506 from two dies 1502,1504 in the ideal design domain, typically CAD (computer aided design) domain. The respective connection lines are connected in connection points 1508.

FIG. 13 illustrates how the result may look in reality after the pattern has been aligned to each die 1502,1504 or other component according to prior art. With transformation of a pattern to individual dies differences in the individual transformations may create edge roughness or even bad connections for lines in the pattern that are intended to connect dies to each other or to other layers. As illustrated in FIG. 13, many of the connection points 1508 are not connected. This makes it unsuitable or even impossible to individually align to each die with the normal current quality requirements. The connection points in the pattern portions comprising the connection points 1508 are clearly misaligned.

PROBLEM

The general object of the invention is to provide a method for enabling connection of individually aligned pattern portions. An aspect of this problem is the reconnection of connection points in pattern portions that have been individually aligned to different dies.

More particularly, the present invention relates to methods and apparatuses for performing pattern alignment with respect to patterns in a plurality of layers.

SUMMARY OF THE INVENTION

The general object is achieved and the problem is solved by providing a method and/or an apparatus and/or a computer program product according to the appended claims.

The invention is applicable to laser pattern imaging of workpieces in the manufacturing of products comprising the patterning of a surface employing a laser direct imaging device. For example, patterning by projecting, writing or printing a pattern on a surface may include exposing a photoresist or other photosensitive material, annealing by optical heating, ablating, creating any other change to the surface by an optical beam, etc.

Examples of such products are printed circuit boards PCB, substrates, flexible roll substrate, flexible displays, wafer level packages WLP, flexible electronics, solar panels and display. The invention is directed to patterning such a photosensitive surface on a workpiece for such products with dies in a direct write machine, where a workpiece can be any carrier of a surface layer upon which a pattern can be printed with a laser direct imaging system.

The more specific problem aspect as stated above is solved by aligning accurately with strict alignment requirements in first, sacred zones and aligning with less strict alignment requirements in a second, stretch zone according to the inventive concept enables individual alignment to each die (component), while avoiding edge roughness and bad connections for lines that should connect the dies with each other or with other layers.

BRIEF DESCRIPTION OF DRAWINGS

The invention will be further explained with reference to the accompanying drawings wherein:

FIG. 1 shows schematically an example of embedded dies in a prior art process description of a fan-out wafer level packaging process.

FIG. 11A-B illustrates in top view and side view how dies in a first work piece layer is overlayed with dies in a second layer of same or different work piece.

EXPLANATIONS OF TERMINOLOGY AND EMBODIMENTS USED IN THIS TEXT

Workpiece

Figures 2, 4:
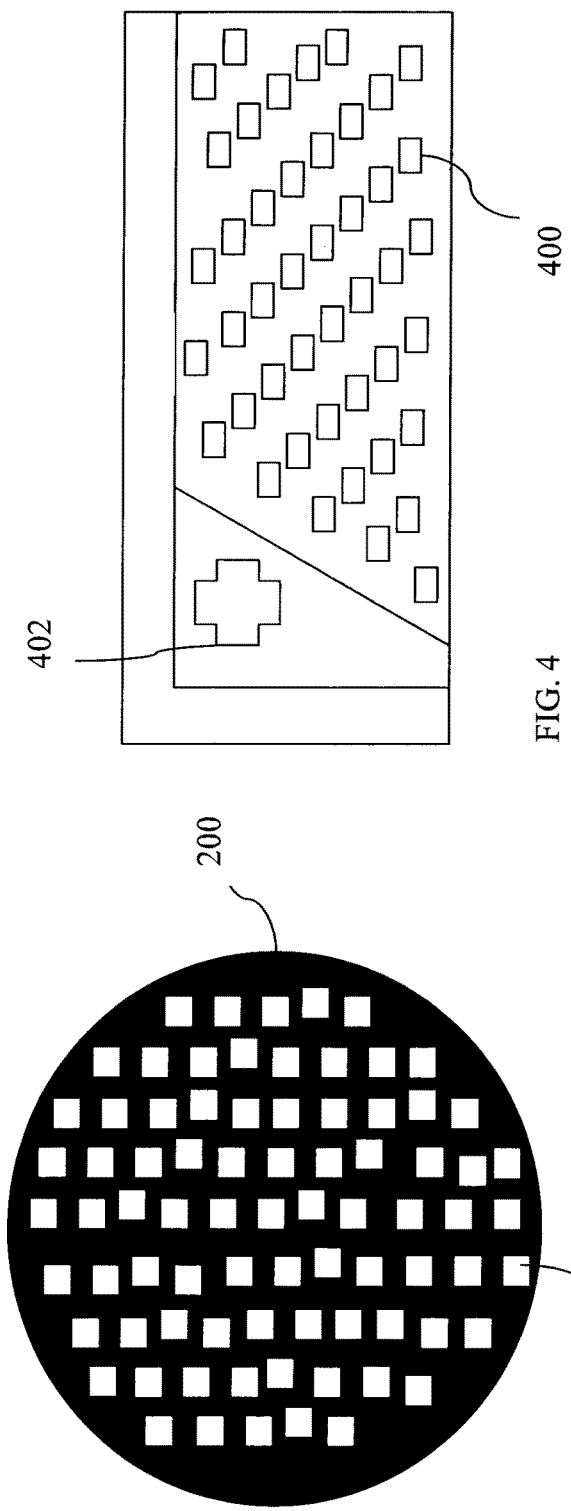
FIG. 2 shows schematically an example of a workpiece with dies distributed thereon.
FIG. 4 shows schematically an example of an alignment mark on a die.
Figure 3:
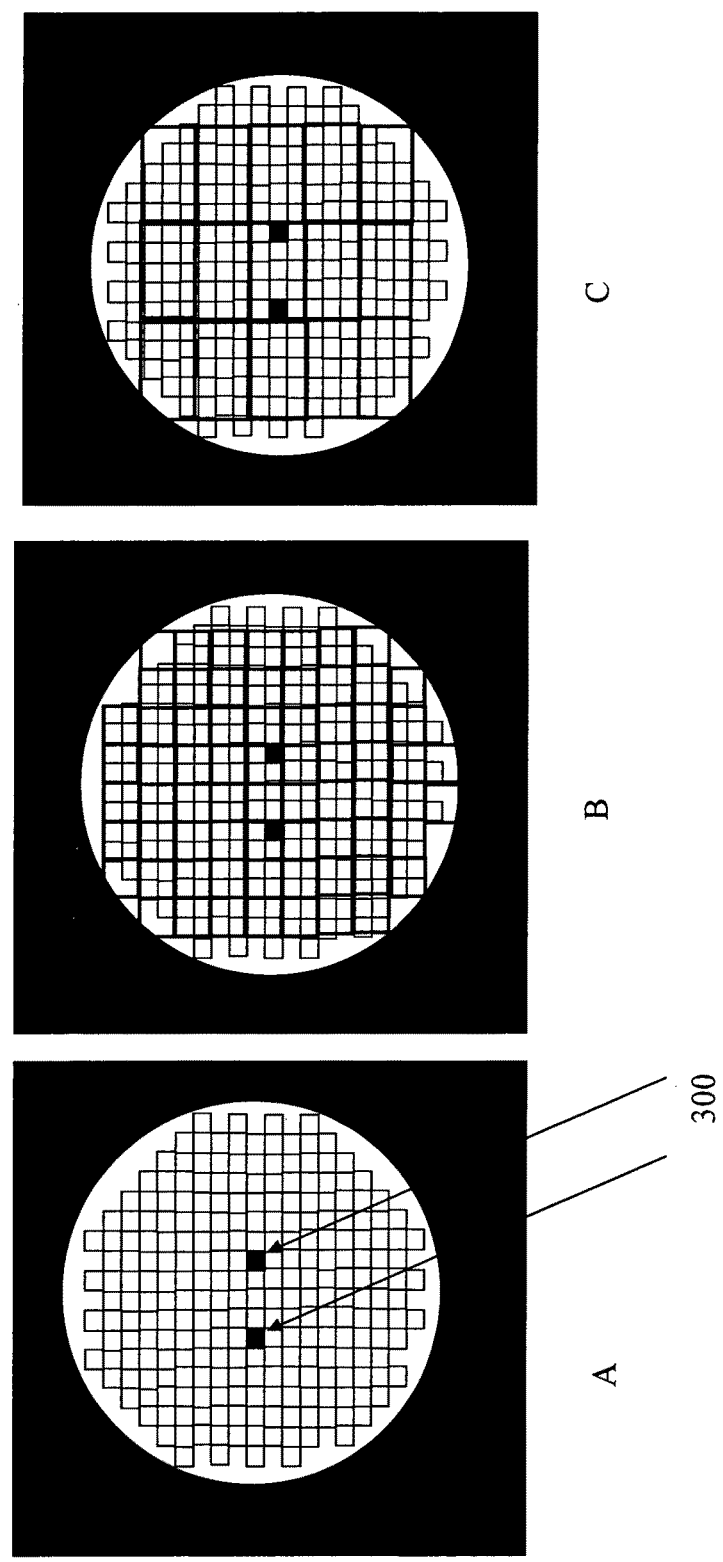
FIG. 3 shows schematically an example of a prior art method for aligning to individual dies or to a group of dies.

For the purpose of this application text the term workpiece is used to denominate any carrier of a surface layer upon which a pattern can be printed with a laser direct imaging system. For example a silicon substrate or a silicon wafer for a printed circuit board workpiece, or an organic substrate. Workpieces may have any shape, such as circular, rectangular or polygonal, and may have any size for example in a piece or in a roll.

Die

For the purpose of this application text the term die is used to denominate a passive component, an active component, or any other component associated with electronics. For example, a die may be a small block of semiconducting material, on which a given functional circuit is fabricated.

Local Alignment

For the purpose of this application text the term local alignment is used to denominate alignment in relation to alignment features, for example alignment marks, on an individual die or on a group of dies.

Global Alignment

For the purpose of this application text the term global alignment is used to denominate alignment in relation to alignment features, for example alignment marks, on a workpiece.

Various Explanations

In the drawings, the thicknesses of layers and regions are exaggerated for clarity. Like numbers refer to like elements throughout the description of the figures.

Detailed illustrative embodiments are disclosed herein. However, specific structural and functional details disclosed herein are merely representative for purposes of describing example embodiments. Example embodiments may be embodied in many alternate forms and should not be construed as limited to only the example embodiments set forth herein. It should be understood, however, that there is no intent to limit example embodiments to the particular ones disclosed, but on the contrary example embodiments are to cover all modifications, equivalents, and alternatives falling within the appropriate scope.

It will be understood that, although the term's first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Example embodiments relate to scanning of workpieces, such as a substrate or wafer, for reading and writing patterns and/or images. Example embodiments also relate to measuring workpieces. Example substrates or wafers include flat panel displays, printed circuit boards (PCBs), flexible printed circuit boards (FPBs), flexible electronics, printed electronics, substrates or workpieces for packaging applications, photovoltaic panels, and the like.

According to example embodiments, reading and writing are to be understood in a broad sense. For example, reading operations may include microscopy, inspection, metrology, spectroscopy, interferometry, scatterometry, etc. of a relatively small or relatively large workpiece. Writing may include exposing a photoresist or other photosensitive material, annealing by optical heating, ablating, creating any other change to the surface by an optical beam, etc.

DETAILED DESCRIPTION OF EMBODIMENTS

The invention is embodied in methods, apparatus and computer program products for patterning a workpiece.

The more specific problem aspect as stated above is solved by aligning accurately with strict alignment requirements in first, sacred zones and aligning with less strict alignment requirements in a second, stretch zone according to the inventive concept enables individual alignment to each die (component), while avoiding edge roughness and bad connections for lines that should connect the dies with each other or with other layers.

In a method, system of apparatus and/or a computer program product configured for patterning a second layer of a work piece in a direct write machine in the manufacturing of a multilayer stack, the work piece has a first layer with a plurality of electrical components in the form of dies that are arbitrarily placed thereon. Each die has connection points whereof some are to be connected between the dies. A selection of said dies are associated with a first pattern wherein different zones that comprises connection points of dies distributed in the first layer are associated with different requirements on alignment.

Sacred zones in the first pattern that have a high requirement on alignment to selected features of the stack or to the placed dies are detected. Further, stretch zones of the first pattern that are allowed to have a lower requirement on alignment to other features of the stack are detected. Then the first pattern is transformed by calculating adjusted first pattern data comprising transformation of the original circuit pattern such that: i. connection points in adjacent sacred zones are aligned within a pre-settable alignment deviation parameter; and such that ii. deviations between the positions of corresponding connection points in the sacred zones are compensated for in the pattern for connection points of the stretch zones. Finally a pattern is written on the layer of the work piece according to the adjusted pattern data.

Operating Environment of the Invention

The invention is typically employed in a scanning laser direct imaging (LDI) system comprising for example a laser direct writer as described in the above mentioned prior art publication US 2003/0086600, which is hereby incorporated by reference as an example of such a machine that may be used for the implementation of embodiments of the invention. In such a system a laser beam is scanned over a photosensitive surface layer of a workpiece to expose the layer with a pattern in accordance with pattern image data. Different embodiments of the invention may include patterning equipment for example for patterning by projecting, writing or printing a pattern on a surface that may include exposing a photoresist or other photosensitive material, annealing by optical heating, ablating, creating any other change to the surface by an optical beam, etc.

The system preferably comprises a computer adapted to control the patterning, e.g. laser beam scanning, dependent inter alia on image pattern data that may be adjusted, compensated or transformed. The system further comprises or is coupled to a computerized measuring system, typically having CCD cameras and recognition software devised to recognize objects such as dies or features such as alignment marks on a workpiece. Measurement data from the measuring system is used in an alignment system to adapt original image pattern data in order to compensate for deviations in the workpiece from assumed conditions. When implementing the invention a computer is provided with specifically designed computer programs adapted to perform steps of the inventive method.

The invention is devised to operate on a workpiece, for example a silicon substrate, an organic substrate or a wafer, that is provided with dies distributed and placed with an arbitrary position on the workpiece. The positions of the dies are defined in a three-dimensional coordinate system and thus indicate location and orientation. For example, the dies may have been placed on the workpiece by means of a pick-and-place machine, resulting in a workpiece with low position accuracy of the dies. The dies shall typically be aligned with a circuit pattern to be printed on a surface layer such that the circuit pattern can be connected to connection points of the dies, for example in a fan-out process. Preferred embodiments are implemented in or in conjunction with a direct write machine and alignment system.

Example of Fan-Out Process

FIG. 1 shows schematically an example of embedded dies in a prior art process description of a fan-out wafer level packaging process. Such a conventional FAN-out process, here exemplified with a prior art fan-out wafer level packaging known to be provided by Infineon (Source: Infineon), typically comprises the following steps:

Step 1: A laminate carrier, for example a carrier wafer, is provided and arranged to receive dies on an adhesive tape.

Step 2: A plurality of dies (of one or several types) are placed on the carrier by means of a pick and place machine.

Step 3: Compression moulding over the dies and the adhesive tape to fixate the dies in a moulded carrier wafer.

Step 4: Separating the carrier from the adhesive tape and the moulded carrier wafer.

Step 5: Removing, for example by pealing, adhesive tape from the moulded wafer to create a reconstituted wafer.

After placing the dies on the moulded carrier wafer, one or more patterning steps are performed on the wafer, for example a selection of:

Step 6: Deposition and patterning of dielectric, possibly a multiple of this step.

Step 7: Metallization and patterning.

Step 8: Deposition and patterning of dielectric.

Step 9: Solder bump deposition to achieve electric connection for external terminals to contact pads coupled to connection points of dies.

An embodiment of the present invention is adapted to be applied for alignment in the patterning steps in this kind of fan-out process in order to improve cost efficiency.

Workpiece with Arbitrarily Placed Dies

As briefly mentioned in the background section FIG. 2 shows schematically an example of a workpiece 200 with a plurality of dies 202 distributed thereon, in this example a reconstituted wafer in an eWLB packaging structure, where eWLB is an abbreviation for embedded Wafer Level Ball Grid Array. As shown in FIG. 2, conventionally, die placement is non-systematic, and a printed field, i.e. a field of printed circuit pattern will have different registration errors in relation to different dies and in practice a workpiece produced like this will have random positional errors. The invention is adapted to enable local alignment of patterns to embedded dies for example in this kind of workpiece.

Figure 8:
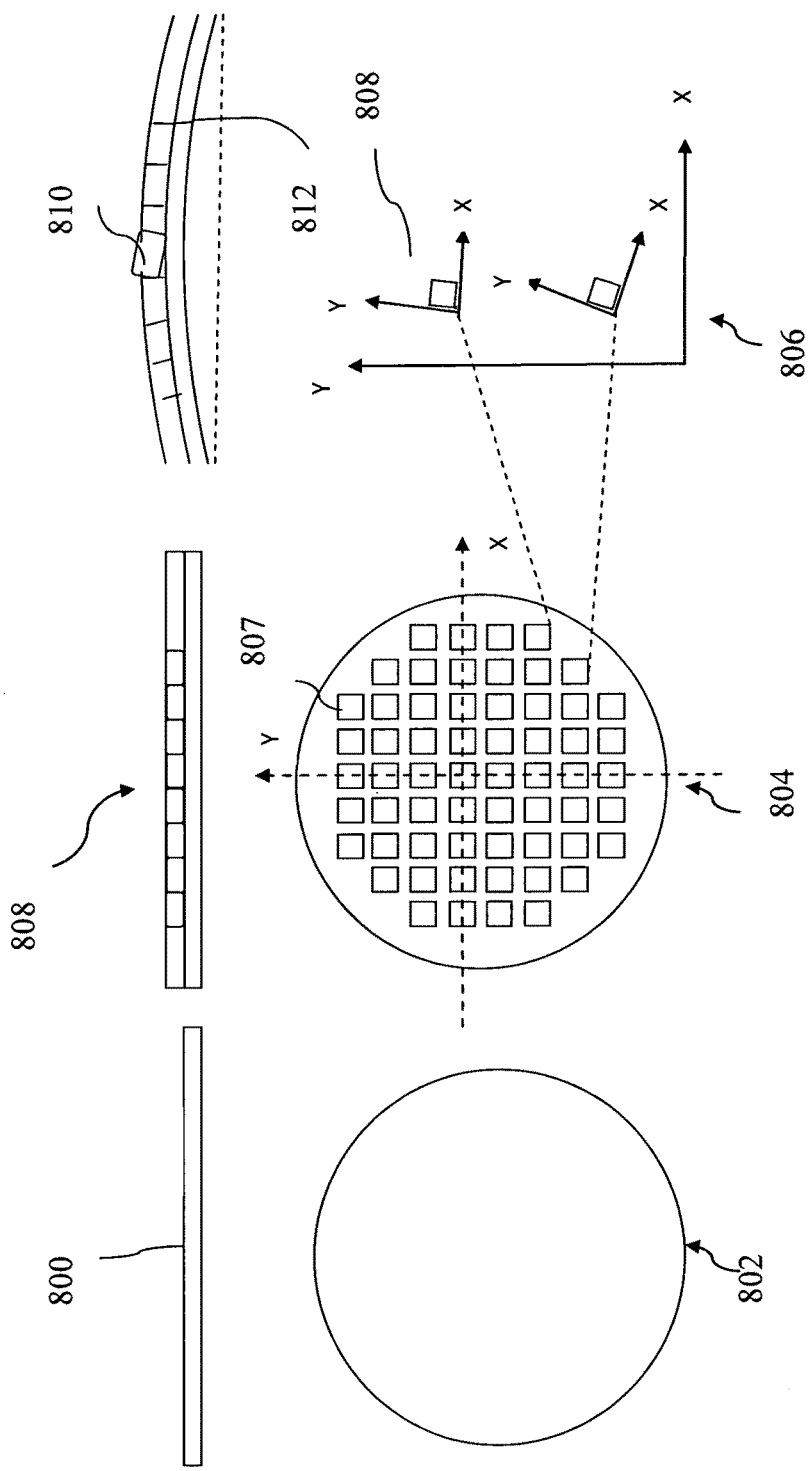
FIG. 8 shows schematically an example of a workpiece with dies distributed thereon, illustrating the local and global location and orientation of dies dependent on the shape of the workpiece.

The workpiece that the invention is intended to operate on has a plurality of dies distributed thereon. It is assumed that the dies are distributed and positioned arbitrarily or randomly on the workpiece, although the dies would normally be placed in a general global order on the workpiece. The positions of the dies would also normally be affected by the shape and shape deviations of the workpiece. FIG. 8 shows an example of a workpiece in the form of a wafer with the local and global location and orientation of dies thereon. To the left there is an original workpiece, in the form of a wafer, from a top view 802 and a side view 800. In the middle there is shown a top view 804 and a side view 808 of a wafer with dies 807 distributed thereon generally ordered and located in rows. To the right there is an illustration of the position of dies 807 in a 2-dimensional global coordinate system 806 and the orientation of individual dies 807 in local 3-dimensional coordinate systems (x,y theta) 808 thus belonging to each individual die. The position of each die may include translation, rotation, warpage, etc. To the right there is also a side view of the workpiece showing global warpage 812 of the wafer and local warpage 810 of the dies.

Embodiments of Method for Patterning a Workpiece

In one variety the invention is embodied in a method for patterning a workpiece for example in a direct write machine. The workpiece has one or a plurality of dies distributed thereon. The direct write machine is provided with a coordinate system for controlling write operations in a per se known manner.

Figure 5B:
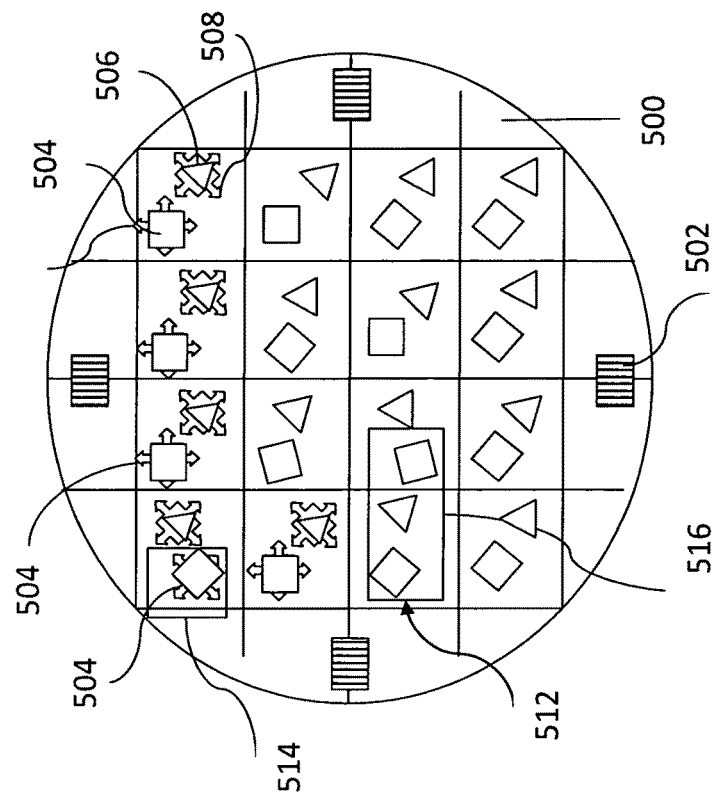
FIG. 5A-B show schematically an example of local pattern adaptation to individual dies in accordance with an embodiment the invention.
Figure 5A:
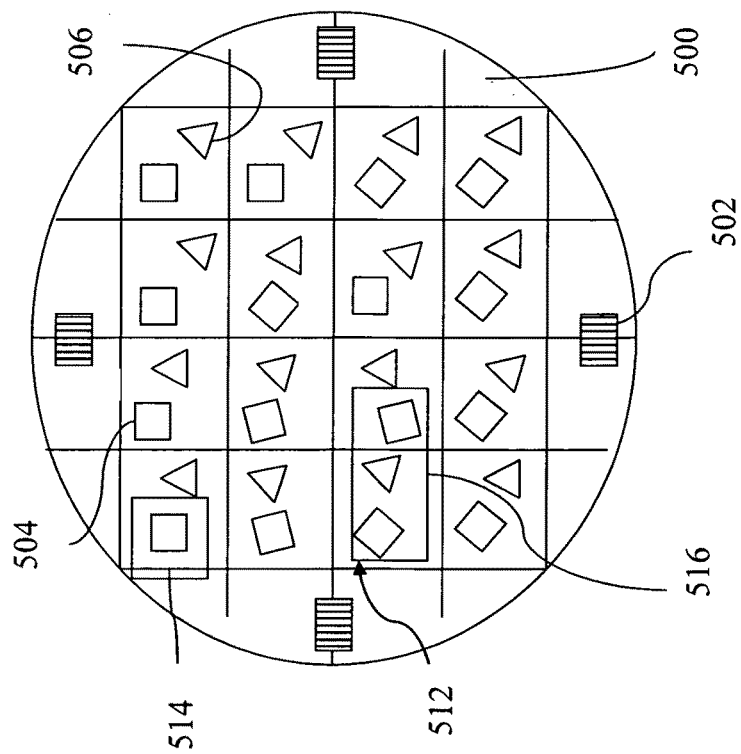

Each die is associated with a circuit pattern in the form of original circuit pattern data. This is illustrated in FIG. 5A and FIG. 5B, which show schematically an example of local pattern adaptation to individual dies on a workpiece in accordance with an embodiment the invention. In FIG. 5A, a workpiece 500 having global reference marks, for example alignment marks, is provided with a plurality of arbitrarily placed dies of two different types, die type 1 504 and die type 2 506. FIG. 4 shows schematically a per se known example of a reference mark 402 in the form of an alignment mark on a die 400, in this example the alignment mark is a bright cross 402. The different die types are to be aligned with different pattern types, pattern type 1 508 and pattern type 2 510. FIG. 5B illustrates that the pattern type 1 508 has been aligned with and printed on a layer over die type 2 506, and that the pattern type 2 510 similarly has been aligned with and printed on a layer over die type 1 504. Further, multiple dies of the same type may have a different type of pattern. In FIG. 5B, the rotation of the pattern has been adjusted to each die (cell). In this connection, a die or a group 512 of dies may be called a cell. It is also possible to have an adjustment for each die (cell) or an adjustment for a group 512 of dies (cells), for example, the same rotation and translation for 3×3 cells.

The workpiece is preferably divided into sub-areas, for example sub-area 514 which is associated with a die 504 that in the exemplifying illustration in FIG. 5B is aligned with pattern 510. A sub-area 516 may also be associated with a group 512 of dies.

Figure 6:
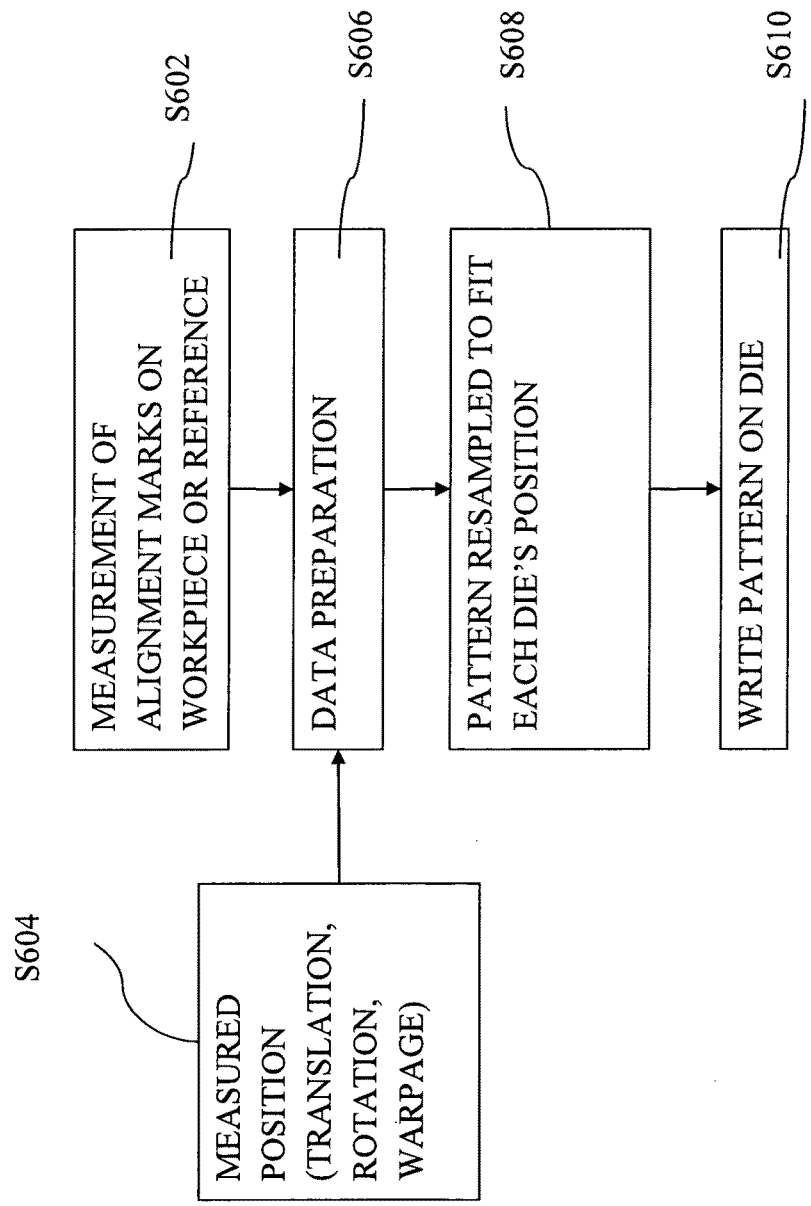
FIG. 6 shows a flow diagram of a method according to an embodiment of the invention.

FIG. 6 shows in a schematic flow diagram an exemplifying embodiment a method for patterning a workpiece. The method shown in FIG. 6 may be implemented in a direct write machine, for example.

Referring to the steps in FIG. 6, this embodiment comprises:

At S602: Alignment marks on a workpiece, for example a wafer, or on a reference die are measured.

At S604: A position of one or more die(s) on the workpiece (e.g. wafer) is measured. As mentioned above, the position of each die may include translation, rotation, warpage, etc. The position of each die may be measured in the same machine comprising the direct write machine, or in an external measurement machine. Steps S602 and S604 may be performed in the reversed order.

If the position of a die is measured in an external measurement machine, the position of the die is relative to some global reference marks on the carrier wafer or a given reference die. If the measurements are performed in the direct write machine, the same principle may be used or the measurements may be used directly in the machine. The position of each die is defined in the coordinate system of the writer by measuring the reference marks and transforming the position and rotation of each die to the coordinate system of the machine. Alternatively, the predefined reference die(s) may be used in the same manner.

Further, according to at least some example embodiments, each die may have alignment marks for measurement. Alternatively, each die may be measured with some shape-based measurement algorithm capable of measuring the absolute and/or relative position of the die without alignment marks, for example, by measuring the shape of the die, the microscopic non-uniformities and/or characteristics that are inherent to a surface of the die and using these measurements for determining the absolute and/or relative position of the die. At least one camera (e.g., a CCD camera or the like) may be used for measuring the shape, features, and/or microscopic non-uniformities of dies or the global workpiece in order to determine the absolute and/or relative position of the dies. The shape and/or position of the die may also be measured using at least one sensor (e.g., a physical sensor or the like). According to certain example embodiments, the position of each die may be measured on the frontside (e.g., the writing side) of the workpiece and/or on the underside (e.g., the backside opposite to the writing side) of the workpiece in combination with (or alternatively without) using alignment marks, where the measured shape and/or microscopic non-uniformities of the frontside or underside of a workpiece is used as a reference position for determining the absolute and/or relative position of a die in or on the workpiece.

As mentioned above, the position of the dies may be determined by measuring microscopic non-uniformities, features or a shape of the global workpiece (e.g., a corner of the workpiece) that is also measurable in the writer where the measured shape, features and/or microscopic non-uniformities of the frontside or underside of the workpiece is used as a position reference for determining the absolute and/or relative position of the dies.

At S606: Pattern data is prepared based on the measured alignment marks and position of each die.

At S608: The pattern to be written is re-sampled to fit the position of each die. In one example, the pattern is re-sampled from original pattern data to fit each die. In another embodiment, the pattern is rasterized from vector data that have been translated or transformed to fit each die. In an alternative embodiment also mentioned below, the coordinate system of the writing tool is transformed in a corresponding manner to fit the original pattern to the positions of the dies, and then the original pattern is written by the transformed coordinate system.

According to example embodiments, different dies may have different types of patterns. As shown in FIG. 5 and explained above, there can be several types of dies, and thus, different types of patterns on the same wafer. FIG. 5 is an illustration of how a pattern may be adapted to the position of a die in these stages of FIG. 6.

At S610: a pattern is written on the wafer, the pattern thus being adjusted to fit each die.

Figure 9A:
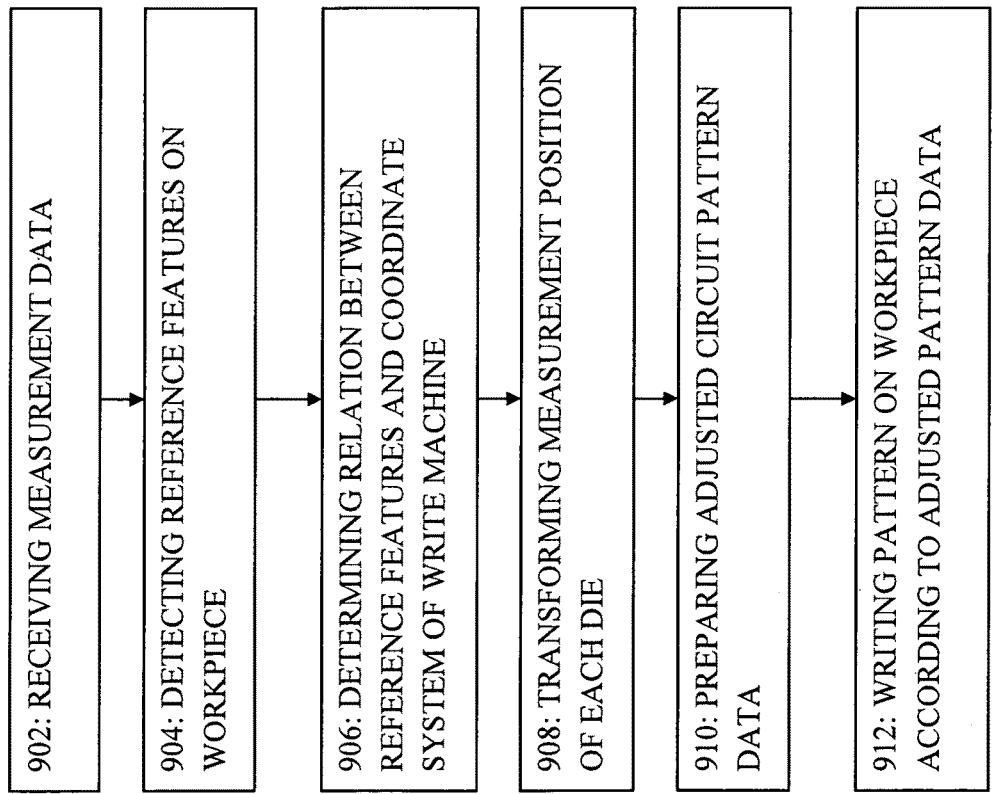
FIG. 9A shows a flow diagram of a method of alignment of pattern to dies according to an embodiment of the invention.

FIG. 9A illustrates schematically further embodiments of a method for patterning a workpiece for example in a direct write machine. The workpiece has a plurality of dies distributed thereon, where the dies are a selection of a passive component, an active component, or any other component associated with electronics. The direct write machine is provided with a coordinate system for controlling write operations in a per se known manner and the method comprises the following steps:

902: Receiving measurement data being associated with the workpiece and indicating a measured position of a plurality of the dies, or group of dies, distributed on the workpiece in relation to at least one reference feature of the workpiece. The measurement data is typically determined by determining a reference feature of the workpiece, and then measuring the position of the die in relation to the reference feature.

In different embodiments further described below, the measurement data file may comprise a list of transformations and areas they cover, alternatively a measurement file with data that describes the transformation in a given point. Measurements on dies have been analyzed in a step before the writer and a high resolution map that describes the local alignment areas and their values is used in the writer.

The position of the dies, or group of dies, is preferably determined in terms of the location and the orientation of the dies on the workpiece in relation to least one reference; and/or the spatial location and orientation of the dies, or group of dies, in a space comprising the workpiece in relation to the reference. In a different wording and as explained above, the position may be indicated as position or location in a 2-dimensional global coordinate system of the workpiece and the orientation of individual dies in a local 3-dimensional coordinate systems (x,y theta) thus belonging to each individual die.

A reference feature of a die is for example determined by a selection of: one or several alignment mark(s) provided on the die; or a characteristic of the surface structure of the die(s); or a characteristic of the shape of the die, such as an edge or a corner of the die.

As explained above, the measuring of the position of a die is for example determined by a selection of:

a. Determining the spatial position of the die in relation to the reference feature by means of a selection of a shape based position determining algorithm, an edge detection based algorithm, a correlation based algorithm or another image analysis techniques devised for extracting a position from a reference feature; or b. Determining the spatial position of the die in relation to the reference feature with one or several alignment mark(s) on the die; or c. Determining the spatial position of the die in relation to the reference feature by a characteristic of the surface structure of the die.

The measurement data may be determined to indicate the position of the dies or of a group or cluster of dies on the workpiece. The measurement data may optionally be determined in a separate measurement machine or in a measurement arrangement that is integrated with or integrated in the direct write machine. The measurement data is preferably received in a computer adapted to manipulate image pattern data and/or to control the writing laser beam of the direct write machine.

Further, the measurement data is optionally determined by determining a reference feature of the workpiece and/or by measuring the position of a group of dies in relation to said reference feature. The measurement data may not necessarily comprise measurement value for every single die. As mentioned, it is also possible to include measurement values for clusters of for example 2×2 dies, 4×4 dies. The measurement value of a cluster may for example indicate an average deviation from a nominal position.

The reference feature of a die is for example determined by a selection or a combination of: one or several alignment mark(s) provided on the die; or a characteristic of the surface structure of the die(s); or a characteristic of the shape of the die, such as an edge or a corner of the die, or by measurement on the writing side or on the backside of the workpiece.

904: Detecting the at least one reference feature of the workpiece, preferably by detecting means in the form of a measurement system.

The reference features of the workpiece may be detected in a similar manner as for the detection of reference features for dies as explained above, i.e. for example by means of alignment marks on the workpiece, by shape or by other characteristic features on the workpiece or among the dies. In exemplifying embodiments, the at least one reference feature of the workpiece is determined by a selection or a combination of: one or several alignment mark(s) provided on the workpiece;

or one or several reference feature(s) provided on one or a plurality of reference die(s) selected among the plurality of dies; or a characteristic of the arrangement of the dies distributed on the workpiece; or a characteristic of the surface structure of the workpiece; or a characteristic of the surface structure of the die(s); or one or several reference die(s); or a characteristic of the shape of the workpiece, such as an edge or a corner of the workpiece; or by measurement on the writing side or on the backside of the workpiece.

906: Determining the relation between the at least one reference feature of the workpiece and the coordinate system of the direct write machine. The relation may optionally be measured or be assumed or be a pre-settable parameter.

The relation that defines how dies are positioned in the direct write machine comprises using a selection of but preferably all of: the position of dies, the position of the workpiece and the position of the coordinate system of the direct write machine.

908: Transforming the measured position of the plurality of dies, or group of dies, distributed on the workpiece to a transformed position defined in the coordinate system of the direct write machine dependent on the determined relation between the at least one reference feature of the workpiece and the coordinate system of the direct write machine.

Typically, all dies are described by a first transformation in relation to the workpiece, then the workpiece is described by a transformation in relation to the coordinate system of the writer.

The transformation may further comprise a transformation of the position and shape of the workpiece to being defined in the writer coordinate system. This is true when the workpiece in the measurement stage has been found to have a transformation that deviates from the ideal transformation. In such a case, measurement data for every die is compensated with the transformation that defines the position of the workpiece in the measurement machine based on the reference position used in the writer, which normally would be nominal positions. Thus, in order to avoid that the different transformations of the workpiece in the measurement machine and in the writer, respectively, shall affect the end result.

Determining a Transformation

The transformation to be applied is determined in a variety of ways, for example dependent on the characteristics of the workpiece and/or the dies distributed thereon.

In one embodiment, the positions of the dies, or group of dies, in terms of both location and orientation on the workpiece together with location and orientation of the workpiece relative the writer coordinate system is used to determine a transformation of the measured positions defined in the coordinate system of the direct write machine.

910: Preparing adjusted circuit pattern data for writing on the workpiece dependent both on the original pattern data and the transformed positions, wherein the adjusted circuit pattern data represents the circuit pattern of the plurality of dies, or group of dies such that the adjusted circuit pattern is fitted to at least a portion of the workpiece area.

Sub-Areas

The adjusted circuit pattern data is in embodiments further rendered such that the adjusted circuit pattern is fitted to a plurality of sub-areas of the workpiece area, possibly wherein each sub-area is associated with a die, or group of dies, among the plurality of dies distributed on the workpiece. Further, the adjusted circuit pattern data may be rendered to be fitted to the plurality of dies, or group of dies, in a way such that the sub-portions of the adjusted pattern data each represents a sub-area of the workpiece associated with a particular die, or group of dies, and where each of said sub-areas includes, or covers, said particular die, or group of dies.

The workpiece may be divided into sub-areas in different ways. In one embodiment, at least a portion of the workpiece area is divided into sub-areas that each are to be represented by sub-portions of the adjusted pattern data, and wherein the sub-areas are identified by the received measurement data and/or the workpiece area is divided into sub-areas by the use of a pre-determined algorithm. In another embodiment, the sub-areas are automatically identified by the received measurement data and/or the workpiece area is automatically divided into sub-areas by the use of the pre-determined algorithm. Further, a plurality of said sub-portions of the adjusted pattern data may be rendered to fit to respective sub-area within certain requirements and/or at least one pre-settable deviation parameter.

For the purpose of preparing adjusted circuit pattern data the measurement may in one embodiment comprise defining a re-sampling map for the whole pattern.

In one embodiment, the preparing of adjusted circuit pattern data comprises transforming the original pattern data in the form of vector data to fit each die, or group of dies, and rasterizing said transformed vector data such that the rasterized vector data represents the whole workpiece having all of the dies distributed thereon.

In another embodiment, the preparing of adjusted circuit pattern data comprises in one embodiment rendering the original pattern data from a set of ideal pattern data. An ideal pattern is in this context the layout and the position of the pattern in the nominal coordinate system, usually a CAD system or similar. Then there is a step of re-sampling the original pattern data dependent on the measured position data of the die(s) and on the transformed position and shape of the workpiece in order to fit data to each die on the workpiece in the coordinate system of the direct write machine. Optionally, there is a step of re-sampling the original pattern data dependent on measured position data of a group or a cluster of the dies and on the transformed position and shape of the workpiece in order to fit data to each group or cluster on the workpiece in the coordinate system of the direct write machine.

Preferably, the adjusted circuit pattern data represents the whole workpiece having all of the dies distributed thereon Requirements and/or Deviation Parameter The fitting of the adjusted circuit pattern is carried out in different optional manners.

For example, a plurality of said sub-portions of the adjusted pattern data are rendered to fit to respective sub-area within certain requirements or one or more pre-settable deviation parameters. The certain requirement or pre-settable deviation parameters are, in different embodiments, associated with at least one of: a. type of die, component, or group of dies/components; or b. a characteristic of the surface structure of the die(s)/component(s); or c. a characteristic of the shape of the die(s)/component(s), such as an edge or a corner of the die(s)/component(s).

In one embodiment, the whole adjusted circuit pattern data is fitted to the plurality of dies, or group of dies, on the workpiece within a pre-settable deviation parameter or set of deviation parameters. The deviation parameter can be defined in different ways, for example with a pre-settable: value, minimum threshold value, maximum threshold value, interval of values or selectable formula for calculating the deviation parameter.

The pre-settable deviation parameters may include both parameter(s) associated with location and parameter(s) associated with orientation.

For example, in one embodiment the deviation parameter is the residual error of the placement or position of the adjusted circuit pattern in relation to the dies is in the range of or less than 100 micrometers (μm). In other embodiment the residual error is in the range of or less than 10 micrometers (μm), in the range of or less than 5 micrometers (μm), or probably most frequently in the range of or less than 1 micrometer (μm). Thus, in different embodiments, the adjusted circuit pattern data is fitted to the plurality of dies, or group of dies, on the workpiece within a the pre-settable deviation parameter that is set to less than 100 μm or less than 10 μm or less than 5 μm or less than 1 μm, for at least some of the dies, or group of dies, distributed on the workpiece.

A deviation from a perfect fitting or match occurs for example if there are a plurality of transformations that must coexist simultaneously in the same area, in this context called a transition zone. In another example, a deviation occurs when the required transformation is a more complex transform than that or those available to apply.

The adjusted circuit pattern data associated with a particular die, or group of dies, is for example fitted individually to said particular die, or group of dies. Preferably, the plurality of dies, or group of dies, includes all of the dies distributed on the workpiece. In one embodiment, the circuit pattern data associated with at least one of the dies, or group of dies, on the workpiece is adjusted individually and independently of circuit pattern data associated with the other dies on the workpiece. In another embodiment, the circuit pattern data associated with each of the dies, or group of dies, on the workpiece is adjusted individually and independently of circuit pattern data associated with any of the other dies on the workpiece.

The preparing of adjusted circuit pattern data comprises in one embodiment rendering the original pattern data from a set of ideal pattern data. An ideal pattern is in this context the layout and the position of the pattern in the nominal coordinate system, usually a CAD system or similar.

Then there is a step of re-sampling the original pattern data dependent on the measured position data of the die(s) and on the transformed position and shape of the workpiece in order to fit data to each die on the workpiece in the coordinate system of the direct write machine. Alternatively, there is a step of re-sampling the original pattern data dependent on measured position data of a group or a cluster of the dies and on the transformed position and shape of the workpiece in order to fit data to each group or cluster on the workpiece in the coordinate system of the direct write machine.

912: Writing a pattern on the workpiece according to the adjusted circuit pattern data.

In a further development the measurement data is received and the steps 904-910 are performed in a sequence, thereby enabling measurement and writing in real time. Preferably, preparing of adjusted circuit pattern data is based solely on measurements and data associated with the workpiece, thereby enabling measurement and writing time in real time.

Different Transformation Options

In different embodiments of the invention there are different optional transformations.

The transformation of the pattern data, vector data or coordinate system to fit the spatial positions of the die(s) or groups/clusters of dies could be either linear or non-linear, such as e.g. a spline, polynomial or projective. Similarly, transforming the measured positions to transformed positions of the dies, i.e. single dies or group of dies, comprises a selection of linear or non-linear transformation. Further, the preparation of adjusted circuit pattern data comprises transforming of the pattern data to fit the positions of the dies, or group of dies, may comprise using a selection of linear or non-linear transformation.

Examples of optional, global or local, transformations according to different embodiment comprise a selection or a combination of: scale, rotation, mean only; affine transformation; projective transformation; bilinear interpolation, spline, polynomial.

Transformation of Coordinate System in Direct Write Machine

The inventive concept can also be applied in an embodiment where the coordinate system of the direct write machine is transformed to fit each die instead of re-sampling or re-rasterizing data. In other aspects this embodiment includes the features described above.

Figure 7:
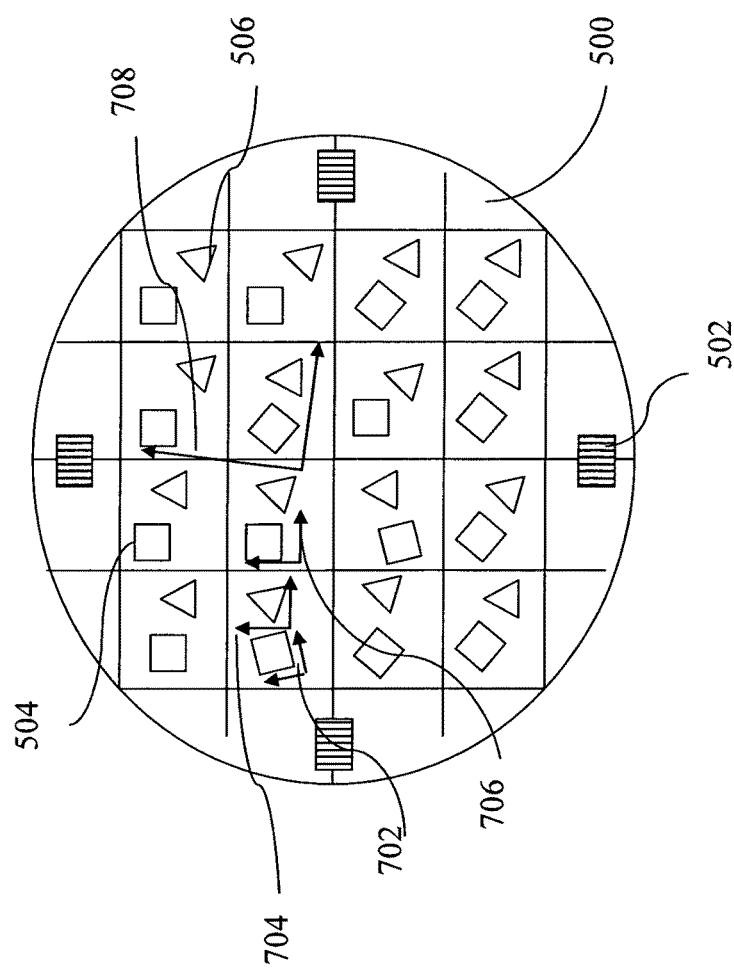
FIG. 7 shows schematically an example of adjustment of a local coordinate system in accordance with an embodiment of the invention.

FIG. 7 illustrates a workpiece similar to that of FIG. 5A and FIG. 5B and the coordinate system of the direct write machine being transformed to fit to the global workpiece in 708 and to individual dies in 702, 704, 706.

In summary this embodiment comprises a method for patterning a workpiece provided with dies in a direct write machine, wherein measurement data of positions of the dies in terms of location and orientation is used to determine a transformation of the coordinate system of the direct write machine such that a predetermined circuit pattern is fitted to each respective die. The predetermined pattern data is written on the workpiece according to the transformed coordinate system of the direct write machine.

In more detail such an embodiment would comprise a method for patterning a workpiece in a direct write machine, wherein
  the direct write machine being provided with a coordinate system for controlling write operations;
  the workpiece having a plurality of dies distributed thereon;
  each die being associated with a predetermined circuit pattern in the form of original pattern data;
  the method comprising the steps of:
    a. receiving measurement data being associated with the workpiece and indicating a measured position of each die in relation to a reference feature of the workpiece;
    b. detecting the predetermined reference feature of the workpiece;
    c. determining the relation between the reference feature of the workpiece and the coordinate system of the direct write machine;
    d. transforming the coordinate system of the direct write machine dependent on the measured position of each die and on the determined relation between the reference feature of the workpiece and the coordinate system of the direct write machine such that the predetermined circuit pattern is fitted to the dies on the workpiece;
    e. writing a pattern on the workpiece according to the predetermined pattern data in the transformed coordinate system of the direct write machine.

Summarizing Embodiments of the Method

An embodiment of the inventive method for patterning a workpiece, for example a wafer, having a plurality of dies, comprises: measuring an alignment mark on the wafer or a reference die among the plurality of dies; measuring a position of at least a first of the plurality of dies; preparing pattern data based on the measured alignment mark and position of at least the first die; re-sampling the pattern data to fit the position of at least the first die; and writing a pattern on the wafer according to the re-sampled pattern data.

Another embodiment comprises: defining the measured position of the first die in a coordinate system of a writer by transforming the position of the first die to the coordinate system of the writer.

The method for patterning a wafer having a plurality of dies, the method comprises: measuring an alignment mark on the wafer or a reference die among the plurality of dies; measuring a position of at least a first of the plurality of dies; preparing pattern data based on the measured alignment mark and position of at least the first die, the pattern data including vector data translated to fit at least the first die; rasterizing the pattern data; and writing a pattern on the wafer according to the rasterized pattern data.

Embodiments of Apparatus for Patterning a Workpiece

Figure 9B:
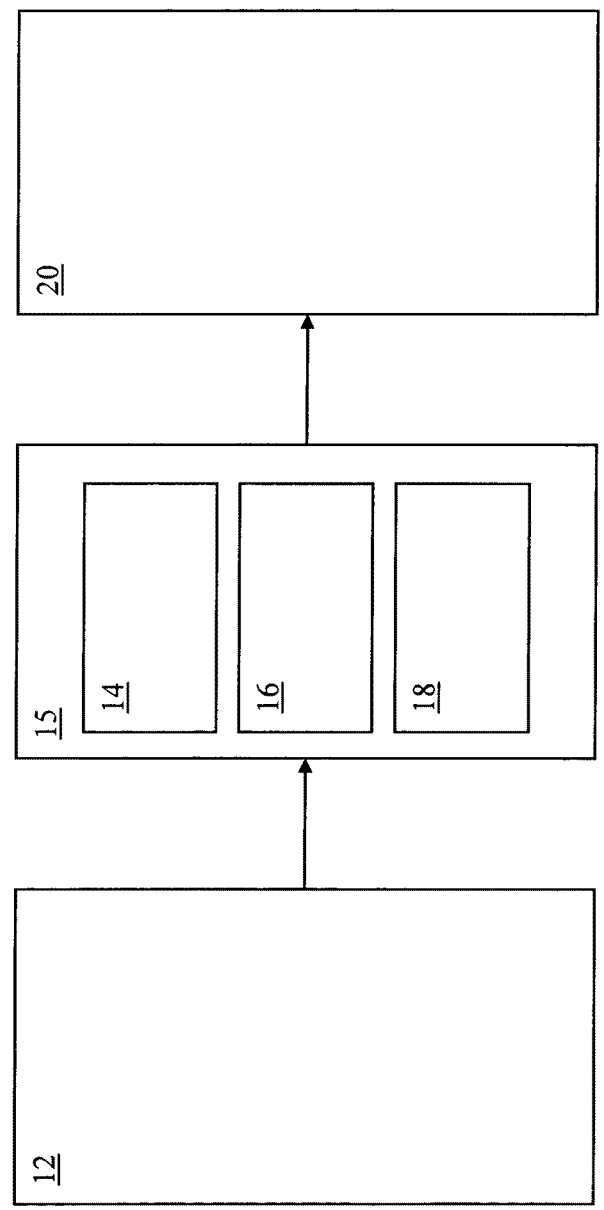
FIG. 9B shows schematically a block diagram illustrating embodiments of apparatus for patterning a workpiece in accordance with the invention.

The inventive method is in preferred embodiments applied in a system of apparatus for patterning a workpiece. FIG. 9B shows schematically a block diagram of illustrating embodiments of apparatus for patterning a workpiece in accordance with embodiments of the invention. The system comprises apparatus units including at least one computer system configured to realizing any of the method steps and/or functions described above inter alia by means of specifically designed computer software program code or specifically designed hardware, or a combination thereof. A computer program product according to the invention comprises computer program code portions configured to control a computer system to perform any of the above described steps and/or functions of the method.

The apparatus illustrated in FIG. 9B comprises a measurement unit 12 that may be a separate measurement unit directly coupled to a writing tool 20 via a computer system 15 for example a laser direct imaging (LDI) computer system 15 and possibly also via a mechanical connection. In one embodiment the LDI computer system 15 receives a measurement file from a separated measurement unit by means of an arbitrary data carrier. The writing tool comprises for example a laser direct write machine.

The computer system 15 comprises a data preparation unit 14, a transformation unit and a writing tool control unit, preferably realized as software, and is communicatively coupled to the writing tool 20. The direct write machine of the writing tool is provided with a coordinate system for controlling write operations on a workpiece and a mechanism configured for detecting a reference feature on the workpiece, preferably by means of imaging technology.

Embodiments of the computer system 15 further comprises a unit for determining the relation between at least one reference feature of the workpiece and the coordinate system of the direct write machine. A data preparation unit 14 also comprised in the computer system 15 is configured to prepare pattern data before and/or after transformation. A transformation unit 16 is in one embodiment configured to transforming the measured position of a plurality of dies to a transformed position defined in the coordinate system of the direct write machine comprised in the writing tool 20 dependent on a determined relation between the at least one reference feature of the workpiece and the coordinate system of the direct write machine. In one variation the transformation unit 16 comprises a re-sampling unit configured to resample the pattern data to fit the dies. In another variation the transformation unit 16 comprises a rasterizer configured to rasterize the pattern data.

The data preparation unit 14 is in one embodiment configured to preparing adjusted circuit pattern data for writing on the workpiece dependent on both the original pattern data and the transformed positions, wherein the adjusted circuit pattern data represents the circuit pattern of the plurality of dies, or group of dies, such that the adjusted circuit pattern is fitted to a plurality of sub-areas of the workpiece area, and wherein each sub-area is associated with a die, or group of dies, among the plurality of dies distributed on the workpiece. The writing tool control unit 18 is configured to control the direct write machine of the writing tool to writing a pattern on the workpiece according to the adjusted circuit pattern data. Similarly, different embodiments of the units of the apparatus are configured to carry out the various embodiments of the method.

In an alternative embodiment of the inventive concept the transformation unit 16 is configured to transform the coordinate system of the writing tool, e.g. a direct write machine, as described above.

Summarizing Embodiments of the Apparatus

An embodiment of the inventive apparatus for patterning a workpiece, for example a wafer, having a plurality of dies, the workpiece or wafer having a plurality of dies, the apparatus comprising: at least one measurement unit configured to measure an alignment mark for the wafer or a reference die among the plurality of dies, and configured to measure a position of a first of the plurality of dies; a data preparation unit configured to prepare pattern data based on the measured alignment mark and position of the first die; a re-sampling unit configured to resample the pattern data to fit the position of at least the first die; and a writing tool configured to write a pattern on the wafer according to the re-sampled pattern data.

In one embodiment of the apparatus, the measurement unit is further configured to define the measured position of the first die in a coordinate system of a writer by transforming the position of the first die to the coordinate system of the writer.

In another embodiment, an apparatus for patterning a workpiece, for example a wafer, having a plurality of dies, the apparatus comprises: a measurement unit configured to measure an alignment mark on the wafer or a reference die among the plurality of dies, and configured to measure a position of at least a first of the plurality of dies; a data preparation unit configured to prepare pattern data based on the measured alignment mark and position of at least the first die, the pattern data including vector data translated to fit at least the first die; a rasterizer configured to rasterize the pattern data; and a writing tool configured to write a pattern on the wafer according to the rasterized pattern data.

In a further embodiment, the measurement unit is configured to define the measured position of the first die in a coordinate system of a writer by transforming the position of the first die to the coordinate system of the writer.

Alignment Between a Plurality of Layers

In a development of the inventive concept, a pattern within a first layer is aligned to certain features in another, preceding or subsequent layer. This is applied in the manufacturing of a multilayer stack of integrated components, i.e. dies in this context, for example a 3D System in Package SiP. According to the invention this is typically achieved by providing a first pattern for a re-routing layer which is aligned and fitted to dies distributed on the first layer of the work piece, and at the same time is fitted to a different second pattern with dies that are to be connected. Possibly, the second pattern is located on a second work piece that is to be connected to the first work piece.

Figure 9C:
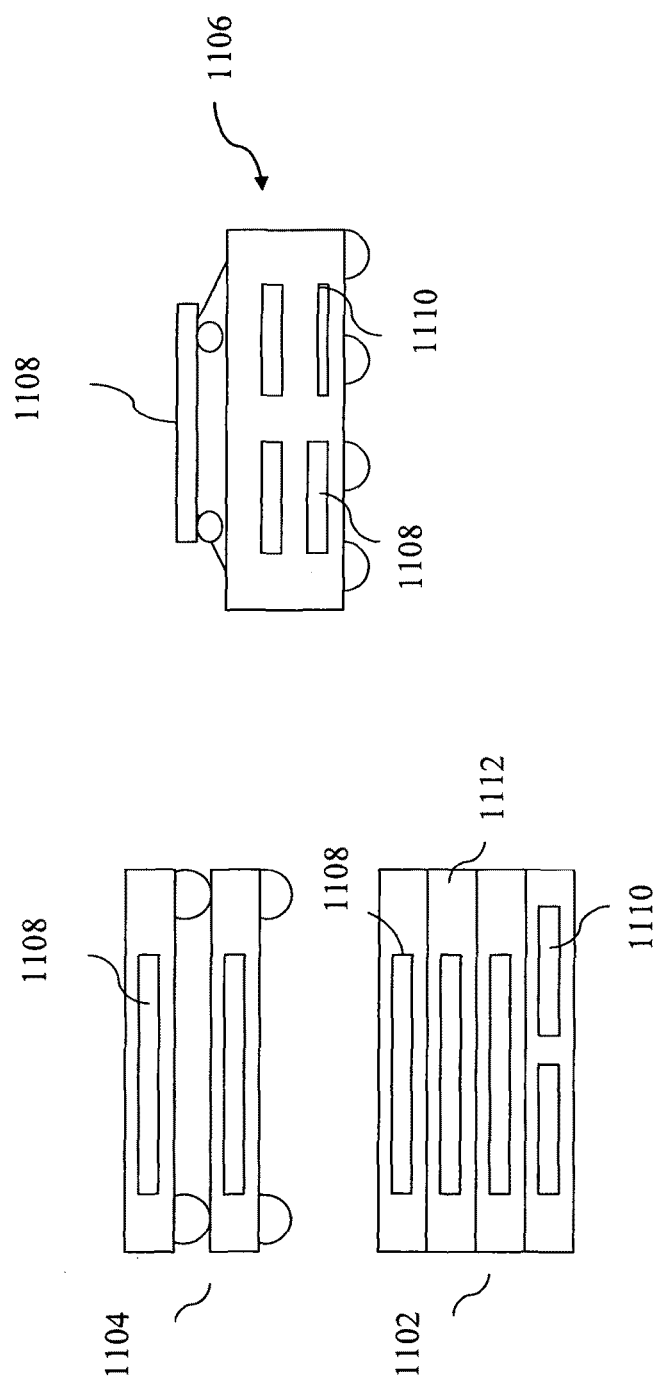
FIG. 9C illustrates an example of a 3D system in package.

FIG. 9C illustrates an example of a 3D SiP. In the example of FIG. 9C, the pieces 1110 represent a first type of dies in the form of active components, whereas the pieces 1108 represent a second type of dies in the form of passive components. The components are connected to the edge of the workpiece 1112 or to each other by a process such as a lithography process.

When dies for example in the form of active and/or passive components are stacked on each other in and/or on a work piece, and/or on separate workpieces that are to be connected, or placed on opposite sides of the workpiece (e.g., as in FIG. 11A-B), one or several parts of the pattern may have a transformation connected to the workpiece where the machine prints and where one or several parts of the pattern have a transformation that is connected to the die (currently known as 2D- or 3D-embedded dies, fan-out dies, double sided fan-out dies, etc.) that comprise the layer(s) on top on this layer.

The purpose of the process is to connect conductive material to the dies/components such that the dies/components are connected to the edge of the workpiece or to each other by a process (e.g., a lithography process). It is relatively important for the quality of the electronic contact that the conductive material connects accurately to the die/component connections.

An LDI may use several different pattern transformations to achieve sufficiently accurate connections. When stacking 3D dies/components, different transformations on different parts of the patterns may suppress and/or prevent tight placement restrictions when placing the components on subsequent layers. Instead, a process similar to a 2D-fan-out or embedded dies combined with pattern transformation may be used for all or substantially layers with relaxed requirements on the die/component registration (placement) for each layer.

FIG. 10A is a top view and 10B is a side view of a workpiece 1204, and illustrate an example of how one part 1202 of a pattern is connected to the dies 1206,1208 on a layer of a workpiece 1204. In FIG. 10B, only one layer of pattern 1202 is shown. However, several pattern layers may be added with same or individual transformation.

Figure 10:
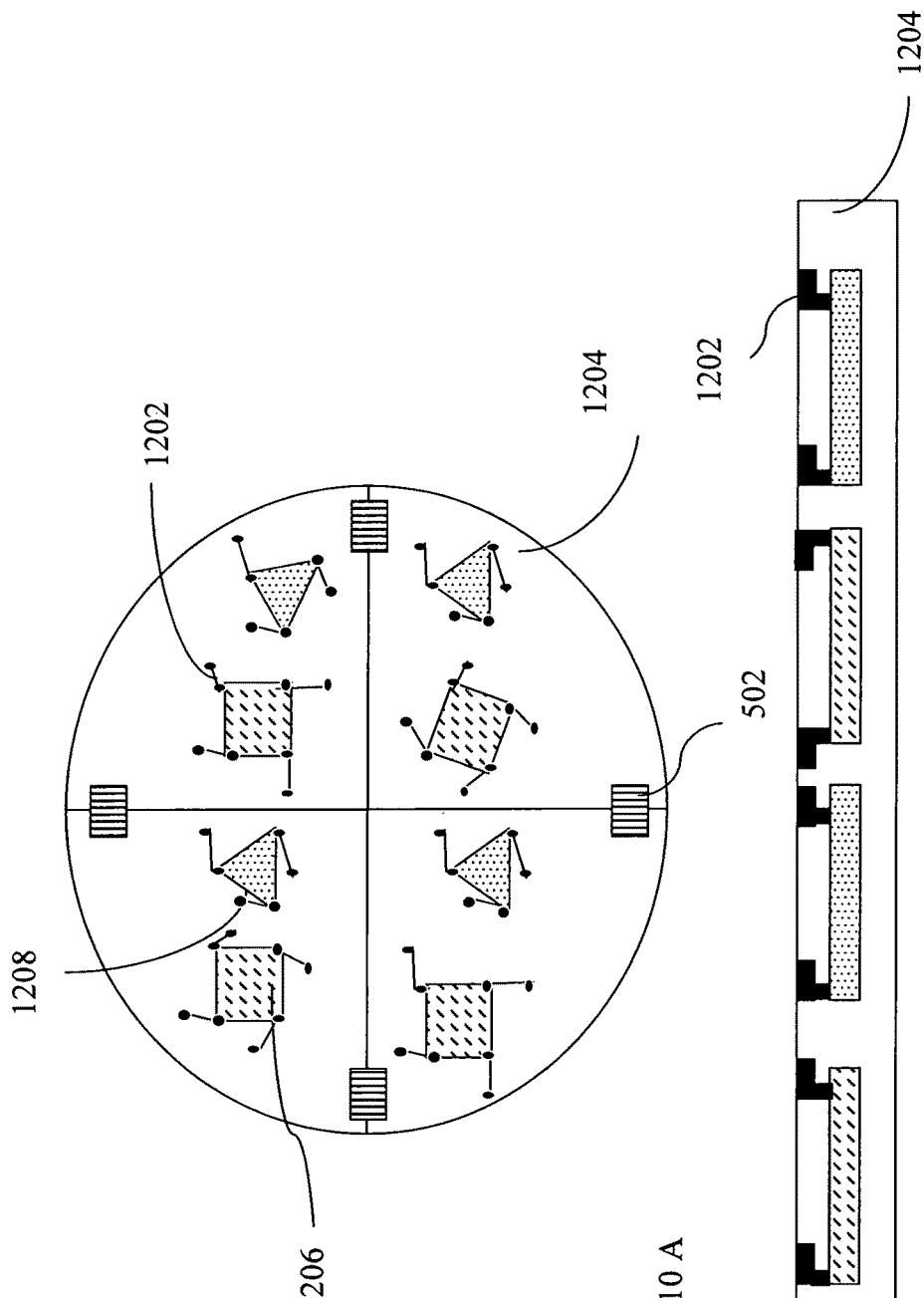
FIG. 10A illustrates an example of how a part of a pattern is connected to connection points of dies in a top view of a work piece.
FIG. 10B illustrates a side view of the example in FIG. 10A.

FIG. 11A is a top view and FIG. 11B is a side view of a multilayer stack, here a system in package stack, and illustrates an example of how a first workpiece 1204 as in FIG. 10 is overlayed with a second work piece 1302 having dies, in this case of a different type distributed thereon.

In FIGS. 11B and 11B, only one layer of a pattern 1202 is shown. However, several pattern layers may be added with the same or individual transformations. Also, only two layers of dies (components) are shown in this example. However, more layers of dies may be added. Also, the dies or other components may be placed inside and/or on the edge of the workpiece. As described above, the transformation for subsequent layers may be based on measurement data. The measurement data may be obtained in the writer or in an external measurement machine. The transformation used for the next layer may not be derived from the previous layer because a specific component may have a connection to other dies, components or PCB/substrate/workpiece or other connectors on higher layers (different layers). Moreover, if a stack includes several workpieces (e.g., carrier wafers), patterning steps may be performed to take care of transformations of surrounding dies, for example wafers/components/PCB/substrate) or parts of surrounding dies on all or substantially all layers connecting the workpieces in the stack. Part of the transformations on both sides may also be taken into account to add up to a total overlay.

Thus, typically a first pattern in a first layer is aligned to dies, or groups of dies, and is at the same time aligned to a second pattern for connection points that are associated with a preceding or subsequent layer. The second pattern is usually a subset of the first pattern, where a part or a portion of the pattern is marked or detected to be set in contact with another layer or pattern. This marking may for example be realized by means of labels in the pattern data file, or be detected automatically by a suitable algorithm.

The alignment of the first pattern to the dies, or group of dies, is preferably carried out as described above. When applying this development of the inventive concept, there is one or a plurality of connection points in the pattern of a currently written layer. The connection point in a pattern may be a line or a point with a dimension delimited for example by the surface layer material or the size of printable features. The connection point may also have a comparatively larger area and have the characteristic of a contact pad. The connection points or the contact pads are intended to be connected to connection points of dies.

The inventive concept is in different embodiments applied as method, a system of apparatus and/or a computer program product configured for patterning a layer of a workpiece in a direct write machine in the manufacturing of a multilayer stack. The direct write machine is typically provided with a coordinate system for controlling write operations on a first layer of a first workpiece typically having a plurality of dies distributed thereon. Typically, each of the plurality of dies have a plurality of connection points.

Typically, each die is associated with a first circuit pattern for a rerouting layer. The circuit pattern of the rerouting layer comprises first pattern portions that shall fit to the connection points of the dies and second pattern portions that shall fit to specific features in at least one other preceding or succeeding second layer. The specific features in the second layer may for example be portions of a second pattern or connection points of dies in the other layer, contact points, contact pads, vias, contacts, lines or other features to which a pattern may be fitted. Further, the second layer may be in the same or in a different work piece that will be connected to the first workpiece. The second layer has for example been previously formed in a preceding layer or is to be subsequently formed in a succeeding layer on the first or second workpiece. It is thus understood that there may be intermediate layers between the first and the second layers. In the case when a first and a second workpiece are connected or adjoined this usually takes place later in a subsequent assembling step and with appropriate alignment between the patterns of the different workpieces. Put in a different wording for some embodiments, the second layer(s) has been previously formed or is to be subsequently formed on the same first workpiece or on/for a second workpiece that is to be joined to the first workpiece in the stack.

The first circuit pattern are in different embodiments represented in the form of original circuit pattern data and/or transformed circuit pattern data adjusted to fit the connection points on the die(s). Such transformed circuit pattern data is preferably adjusted by means of the above described method.

Figure 11C:
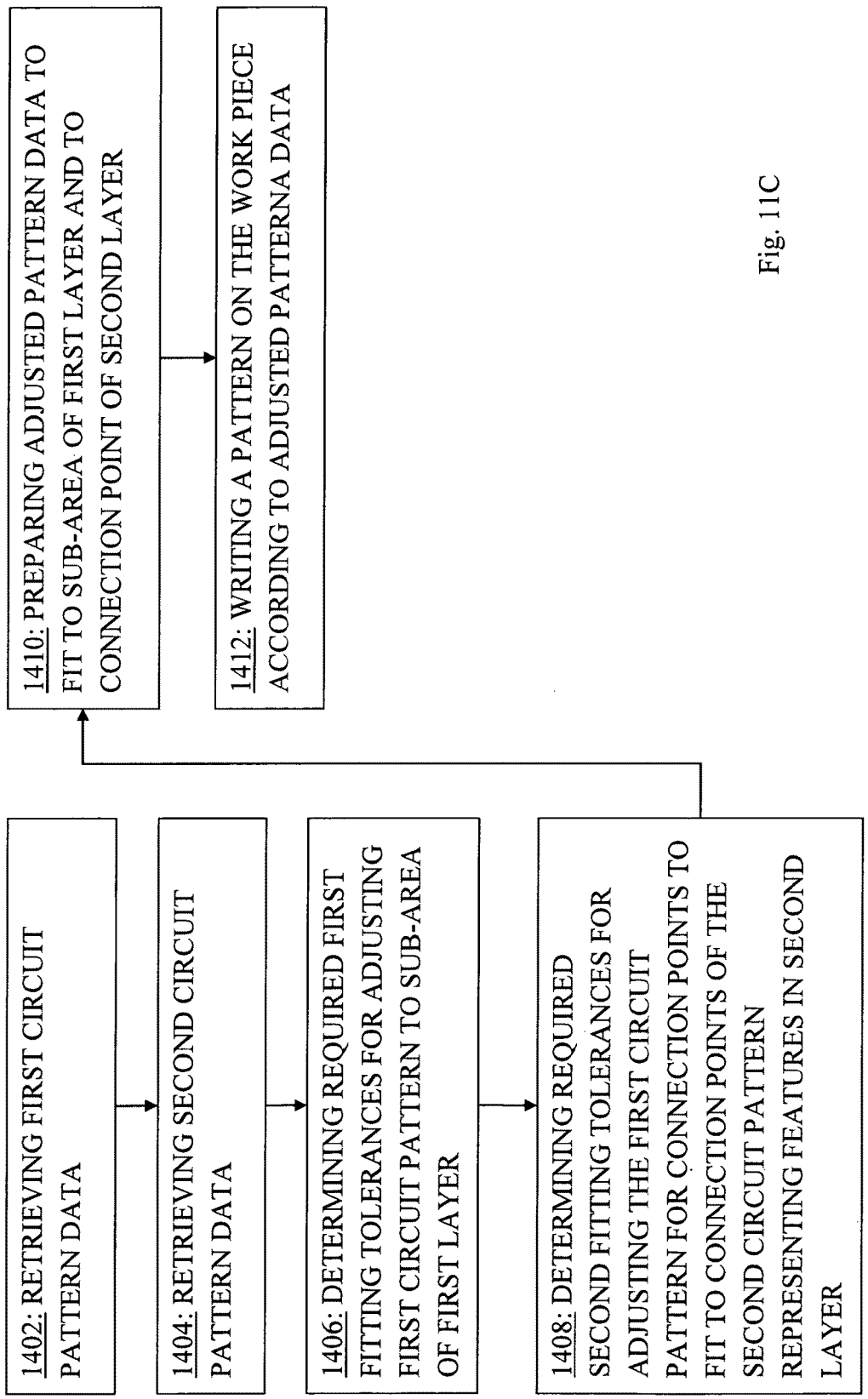
FIG. 11C shows a flow diagram of alignment of pattern to features in a plurality of layers.
Figure 12:
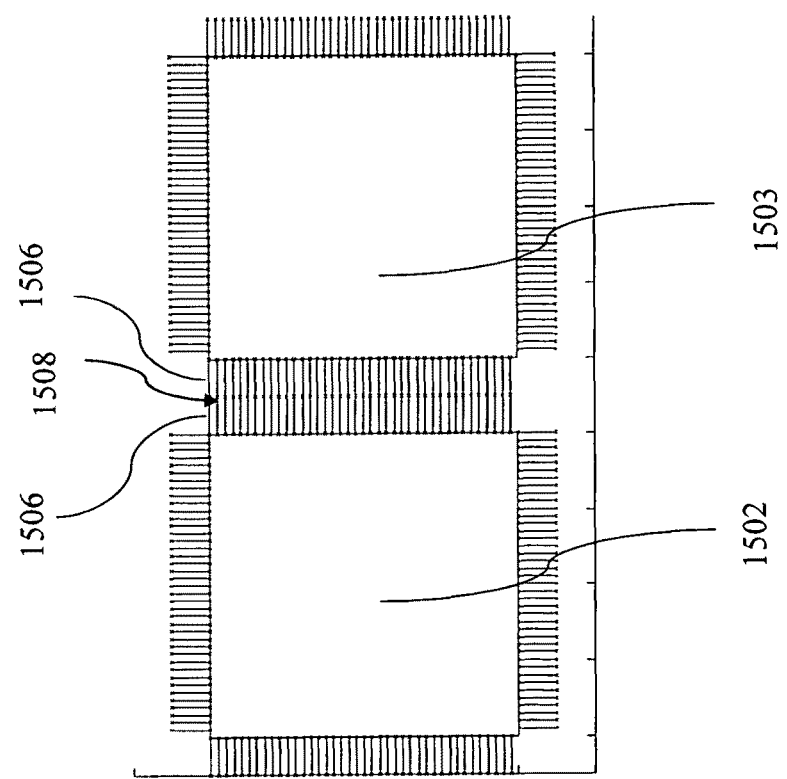
FIG. 12 illustrates a pattern in the design (CAD) domain.
Figure 13:
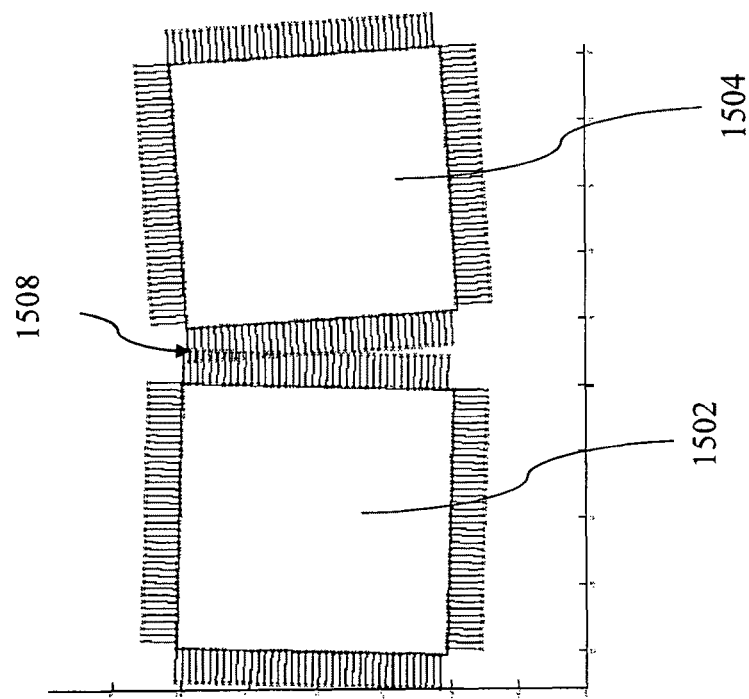
FIG. 13 illustrates an example after a pattern has been adjusted to the transformation of each die.

Embodiment of the method, which is schematically shown in FIG. 11C, comprises a selection of the following steps:

1402: Retrieving first circuit pattern data of a first circuit pattern representing at least one first sub-area of said first layer of the first workpiece.

1404: Retrieving second circuit pattern data of a second circuit pattern representing at least a second sub-area associated with a plurality of connection points of one or a plurality of specific features of a second layer(s).

1406: Determining required first fitting tolerance(s) for adjusting the first circuit pattern at least to the first sub-area of the first layer.

1408: Determining required second fitting tolerance(s) for adjusting the first circuit pattern so that the connection points of the adjusted first circuit pattern fit to the connection points of at least one second circuit pattern.

1410: Preparing adjusted first circuit pattern data that fit the adjusted first circuit pattern.

1412: Writing a pattern on the first workpiece according to the adjusted first circuit pattern data.

Details and embodiments of these steps are further explained below.

1402: Retrieving first circuit pattern data of a first circuit pattern representing at least one first sub-area of said first layer of the first workpiece, wherein the at least one first sub-area is associated with, and is covering, at least one die of the plurality of dies of the first layer.

1404: Retrieving second circuit pattern data of a second circuit pattern representing at least a second sub-area associated with a plurality of connection points of one or a plurality of specific features of a second layer(s), wherein the second layer(s) is one or a plurality of preceding or succeeding layer(s) of the first workpiece and/or one or a plurality of layer(s) in a second workpiece that is to be connected to the first workpiece, and wherein at least one of the plurality of connection points of the at least one die of the first layer is adapted for connecting to at least one of the connection points of the one or plurality of specific features of the second layer(s).

In different embodiments, at least some of the specific features of the second layer(s) represent contact points in form of, or associated with, one of pads, vias, contacts, lines or dies.

As mentioned, the second layer may have been previously formed on a surface of the workpiece, or may be subsequently formed in the same or in a different workpiece.

The first circuit pattern data and/or the second circuit pattern data may for example be received or retrieved from original pattern data, from measurement data produced by a measurement stage or from adjusted pattern data generated in a previous alignment procedure, such as that described above. So, in one embodiment the retrieving of first circuit data of the first circuit pattern comprises the steps of:

a. receiving measurement data being associated with the first workpiece and indicating a measured position of a plurality of the dies, or group of dies, distributed on the first workpiece in relation to at least one reference feature of the workpiece;
b. detecting the at least one reference feature of the workpiece;
c. determining the relation between the at least one reference feature of the first workpiece and the coordinate system of the direct write machine.

1406: Determining required first fitting tolerance(s) for adjusting the first circuit pattern at least to the first sub-area of the first layer

1408: Determining required second fitting tolerance(s) for adjusting the first circuit pattern so that the connection points of the adjusted first circuit pattern fit to the connection points of at least one second circuit pattern representing the one or plurality of dies of the second layer(s).

1410: Preparing adjusted first circuit pattern data that fit the adjusted first circuit pattern to:
  i. the at least one first sub-area of the first layer within the required first fitting tolerances; and
  ii. the at least one of the connection points of the at least one die of the first circuit pattern representing the at least one first sub-area to the at least one of the connection points of the one or plurality of dies of the at least one second circuit pattern within the second fitting tolerance(s).

The adjusted first circuit pattern data is preferably prepared by transforming connection point patterns of the first pattern data to adjusted connection point patterns having positions and surface areas covering the required second fitting tolerance(s). The position of an adjusted connection point pattern is the nominal position of the connection point pattern in the original circuit pattern data of the second circuit pattern.

One embodiment is configured to make the adjusted connection point patterns each have a position and surface area within which all points have a distance less than the required fitting tolerance(s) from the ideal position.

In one embodiment the preparing of the adjusted first circuit pattern data comprises:
a. rendering the first circuit pattern data from a set of ideal pattern data;
then
b. re-sampling the first circuit pattern data in order to fit the adjusted first circuit pattern to
  i. the at least one first sub-area of the first layer within the required first fitting tolerances; and
  ii. the at least one of the connection points of the at least one die of the first circuit pattern representing the at least one first sub-area to the at least one of the connection points of the one or plurality of dies of the at least one second circuit pattern within the second fitting tolerance(s).

Another embodiment, the preparing of the adjusted first circuit pattern data comprises re-sampling the first circuit pattern data in order to fit the adjusted first circuit pattern data to the at least one first sub-area of the first layer, wherein the first circuit pattern data is re-sampled independently of the re-sampling of the at least one second circuit pattern data; and merging the re-sampled first circuit pattern data with the at least one re-sampled second circuit pattern data in order to produce a re-sampled third circuit pattern data representing both the adjusted first circuit pattern and an adjusted at least one second circuit pattern within the first and the second fitting tolerances. This is further explained below in connection with an embodiment employing merging of data collections.

A further embodiment comprises transforming the measured position of the plurality of dies, or group of dies, distributed on the workpiece to a transformed position defined in the coordinate system of the direct write machine dependent on the determined relation between the at least one reference feature of the workpiece and the coordinate system of the direct write machine; preparing the adjusted first circuit pattern data for writing on the workpiece dependent on the original pattern data and the transformed positions, wherein the adjusted first circuit pattern data represents the circuit pattern of the plurality of dies on the first workpiece, such that the adjusted first circuit pattern is fitted to a plurality of sub-areas of the first workpiece area, and wherein each sub-area is associated with a die, or group of dies, among the plurality of dies distributed on the workpiece.

The preparing of the adjusted first circuit pattern data may also comprise rendering the first circuit pattern data from a set of ideal pattern data; then re-sampling the first circuit pattern data dependent on the measured position data of the at least one die(s) and on the transformed position and shape of the first workpiece in order to fit data to each die on the first workpiece in the coordinate system of the direct write machine;

or re-sampling the first pattern data dependent on measured position data of a group or a cluster of the plurality of dies and on the transformed position and shape of the workpiece in order to fit data representing the associated with the plurality of on the first workpiece in the coordinate system of the direct write machine.

So, for example, as shown in FIG. 11B, the connection point pattern 1202 is transformed such that a connection point 1310 of a die 1206 in a first layer 1204 and a connection point 1312 of a die 1306 in a second layer falls within the area of the connection point pattern 1202, and thereby both connection points 1310,1312 are able to make electric contact via the connection point pattern 1202.

1412: Writing a pattern on the first workpiece according to the adjusted first circuit pattern data.

The steps above may further comprise the step of first determining required fitting tolerances for adjusted connection points to fit to the connection points of the dies in the first circuit pattern.

These steps may comprise steps as described above for the part of the inventive concept operating to align circuit pattern data to dies on a workpiece.

Adjustment of Connection Points and Required Fitting Tolerances

The position of connection points, for example pads or conductor lines, that are to be aligned downwards with previous layers or upwards with subsequent layers is in one embodiment provided in the form of a measurement data file. Preferably, the manufacturer, i.e. the operator of the direct write machine, specifies a tolerance or a set of tolerances that should be achieved between the written points, pads or lines and their respective ideal position before or after a transformation. The ideal positions are given in the ideal pattern data from the design of the pattern. The position and/or fitting of the resulting written pattern is, in one embodiment, measured after or in connection to writing and the achieved fitting is compared to the required fitting tolerance. If the achieved fitting is outside the required fitting tolerances, the machine is for example controlled to provide a warning signal or stop writing operations.

The thresholds for required fitting tolerances are preferably dependent on the specific layer or type of layer, or specific product or type of product that is manufactured. The required fitting tolerance for different types of layers and products may for example be between less than (<) 50 µm (micrometers) and less than (<) 1 µm (micrometer) from the ideal position. In one example of a use case the required fitting tolerance is in the range of less than (<) 5-8 µm (micrometers).

The adjusted connection point pattern and the required fitting tolerances are in different embodiments determined in a variety of manners. In one embodiment the position of an adjusted connection point pattern is the nominal position of the connection point pattern in the original circuit pattern data of the first circuit pattern. In one embodiment, the required fitting tolerance is determined as a position and/or a surface area covering a projection of the connection point of the first circuit pattern and a projection of the connection point of the second circuit pattern when the patterns are aligned. In another embodiment, the required fitting tolerance is determined by transforming said patterns and said layers to a common plane, and calculating the required fitting tolerance based on distances between ideal pattern data and adjusted pattern data in said common plane.

The adjusted connection point patterns may each have a position and surface area within which all points have a distance less than the required fitting tolerance from the ideal position. Fitting tolerances are often defined as a distance that is described by the Euclidian norm in an arbitrary dimension, usually in 2D (x,y). In embodiments for different applications, the required fitting tolerance(s) is a distance of less than 50 µm from the ideal position; or a distance less than 1 µm from the ideal position; or a distance less than 5-8 µm from the ideal position.

This development of the inventive concept for providing alignment between a plurality of layers is readily combined with the alignment of pattern to dies within a single layer as described above. The method for providing alignment between a plurality of layers is in embodiments similarly realized as a system of apparatus and/or a computer program product.

Embodiment Employing Merging of Data Collections Representing Pattern

In one embodiment, the preparing of adjusted circuit pattern data comprises storing pattern data for different transformation zones, possibly including stretch zones as explained below, from different layers in separate data collections, rasterizing and transforming said data collections separately, then merging said separate data collections into a single data collection.

As described above in one embodiment, the preparing of adjusted first circuit pattern data comprises re-sampling a first circuit pattern data. The first circuit pattern data is re-sampled independently of the re-sampling of a second circuit pattern data. Then the re-sampled first circuit pattern data is merged with the re-sampled second circuit pattern data in order to produce a re-sampled third circuit pattern data representing both the adjusted first circuit pattern and an adjusted second circuit pattern.

In an example of a practical implementation, pattern data in the form of pixel maps are merged and resampled. This may include having a user defining different parts or portions of the pattern in a data file (data collection), for example pertaining to different layers, and then rendering every portion e.g. corresponding to every layer with its own distortion map.

A merging and resampling component receives standard pattern data and custom pattern data on two data paths. The data paths may be physically separate or interleaved, as on a single data bus or memory access channel. By "data path," we mean to refer to how data is delivered to the resampling and merging component. The data may come from vector or raster data and may be stored on rotating or non-rotating memory.

For manufacturing, design data, typically a vector data set, is converted into a common vector format. Vector domain geometry processing is applied in this format. The vector format is then rendered into a geometrical pixel map, producing what we refer to as "standard pattern data". Pixel domain image processing is applied and the data is resampled into a modulator dependent format for printing.

There are other cases in which edges of a die require different patterns than the main field of the die. For these purposes, a second pixel map of custom pattern data can be used. We disclose merging and resampling the standard pattern data with the custom pattern data, for instance at the time when the data is being used to form latent images.

The merging can be performed at various times, before or after resampling. Resampling in this context means resampling in order to fit a pattern to underlying patterns (not to confuse with resampling for different zones as in other embodiments described in this text). Thus, first every file with its transformation is resampled, and thereafter it is in this embodiment optional to merge the bitmap files to a single file before or after resampling is carried out.

Accordingly, merging and resampling are represented by a single component and may be claimed as a single action, because the order of merging and resampling depends on the nature of the standard and custom pattern data. In some use cases, the merging can be done before resampling, allowing the processing to be performed off-line, where time is less critical. Then, on-line processing is more nearly time-wise deterministic, allowing optimization of compute power. The resampling operation transforms one input map into one output map, which simplifies the resampling operation. The combined pixel maps can be accessed for inspection prior to printing.

When merging is performed during resampling, the custom pattern data pixel maps can be generated immediately before printing, immediately before the modulator pixel map is generated. One example of recent custom pattern data is generated near the time of production with the exact production time to be merged into the pattern.

When merging is performed after resampling, the additional pixel maps may also be merged into an existing modulator pixel map. This can be beneficial when the data flow is partitioned in a way that requires a merge of multiple modulator pixel maps prior to printing.

During merging, the custom pattern data can be tested to determine whether any customization is required in a particular area, frame or tile. If there is no customization, the merge can be optimized, whether by bypassing the merge altogether or performing a merge that will not change the pixel values in the standard pattern data.

The merge between the standard pattern data in the base geometrical pixel map and the custom pattern data in additional geometrical pixel map(s) can be performed for matching or much different pixel grids. First, identical and aligned pixel grids can be merged. In the simplest form, the merge is performed on multiple pixel maps where the grids and tiles are matching, i.e., the pixel dimensions and the alignment of the maps are identical. In this case, the merged can be performed before resampling, pixel-to-pixel, with a simple merge operation. Alternative merge operations are described below.

Second, identical but offset pixel grids can be merged. Here, the grids of the multiple pixel maps have the same pixel dimensions, but are offset so that a single pixel in one map does not correspond to a single pixel in the other map. In this case, the offset can be removed by snapping the offset of the additional maps to match the base map. Then the merge is performed before resampling, pixel-to-pixel, with a simple merge operation. Or, multiple adjoining pixels in the additional map can be resampled to decide the value of the resulting pixel to be merged.

Third, non-matching pixel grids can be merged. An example comprises grids of different pixel size and tile size. The standard pattern data is in a first grid and the custom pattern data is in a second grid. Three pixels of custom data fit over twelve pixels of standard data. A connecting pattern overlays pads of an open gap. This is a simplification of programming a custom pattern of ones and zeros as closed and open connections. When the pixel grids are not matching, either by pitch or offset, the merge can be performed by resampling the images to a common grid and tile. Or, multiple grids could be resampled at the same time and the resampling results merged.

When pixel grids match, the merge can be done pixel-by-pixel with a simple one-to-one merge operation. Depending on the data involved, different merge operations can be used, such as Replace, Add, Subtract, XOR, AND, OR. The operations Replace, Add and Subtract can be used for pixels are represented by floating point or integer values, but the logical operations are difficult to apply to floating point values, due to exponent scaling. If the pixels are represented by integer values, any of these merge operations can be applied.

Workpieces that can benefit from custom pattern data include silicon or semiconductor wafers, circuit boards, flat-panel displays and substrates of flexible material used in roll-to-roll production. For example a circular wafer and a rectangular substrate on which multiple dies are formed. The dies are separated to form chips or flat panel substrates.

Data for a pixel-based exposure system that prints in a sequential manner is "flattened" (all data contributing to one pixel aggregated) and localized. The pattern represented as a rendered geometrical pixel map (GPM 121) fulfils these properties and makes a suitable format as intermediate storage.

A re-sampling process converts the GPM into modulator pixels in a modulator pixel map (MPM 123). Image processing and morphological operations can also be applied during this re-sampling process. It is possible to apply the image processing and morphological operations at both local parts of the pattern, such as over the exposure system field of view, or globally over the pattern. The image processing and morphological operations include, but are not limited to, scaling, translation, rotation, distortion and sizing. These operations can be used to compensate both for how the exposure system projects pixels onto the mask/substrate and for properties of the mask/substrate.

Due to fidelity requirements and the potential information loss during the re-sampling process, the intermediate pixel map (GPM 121) has a higher resolution than the Modulator Pixel Map (MPM 123). By using gradient information in the re-sampling process, the memory resolution required to satisfy the requirement of the GPM 121 can be significantly reduced.

The majority of the pattern dependent processing steps are done during generation of the GPM 121. The re-sampling is primarily used to handle localized pattern dependent (morphological) operations. It is advantageous to limit re-sampling to localized pattern dependent operations, as this improves the predictability of computational effort for the re-sampling. Predictable computational effort, in turn, makes it easier to optimize the configuration.

The technology disclosed includes a method of forming a custom latent image in a photosensitive layer over a substrate. This method includes receiving standard data on a first data path and receiving custom pattern data on a second data path. We intend for data paths to be broadly construed. Standard pattern data is pattern data that is repeatedly used for multiple dies or areas within a die and for multiple substrates in a batch, subject to customization. Custom pattern data is used to modify the standard pattern data to produce a custom latent image. The method further includes resampling and merging the standard custom pattern data to form a merged-rasterized pattern data that represents the physical, custom latent image to be formed in a radiation sensitive layer. A latent image may be positive or negative, depending on the resist or other radiation sensitive material applied over the substrate. In typical device manufacturing processes, a latent image is developed and parts of the radiation sensitive layer removed to form a pattern. The pattern is used to add or remove material as part of forming electronic devices.

Pattern Reconnection after Individual or Multipart Alignment

A further development of the inventive concept deals with the problem aspect of achieving reconnection or healing of pattern portions that comprises connection lines between dies after an alignment. Embodiments of this part of the invention are devised to recalculate the pattern in order to enable two or more arbitrarily placed dies to be interconnected. These embodiments are applicable in combination with the above described embodiments for interconnecting dies in the same layer, or to adjust connection points in a first pattern portions of a first layer to fit to second pattern portions associated with features, references or dies in a second layer. This development adjusts a pattern to fit first connections points (or connection pads) associated with a first die to second connection points (or connection pads) for example of a second die or a second pattern.

This further development of the inventive concept is based on a partition of areas on a work piece into first areas and second areas (or first and second sub-areas) with different requirements on alignment backwards in relation to preceding layers. The first areas are here called sacred zones and need to be well aligned to layers beneath a currently processed or patterned second layer. The second areas are here called sacred zone and are less sensitive with regard to alignment to preceding layers beneath the current layer or to subsequent layers above the current layer.

Embodiments of this further development is applied as a method, a system of apparatus and a computer program product configured for patterning a second layer of a work piece in a direct write machine in the manufacturing of a single or multilayer system-in-package stack. The work piece typically has a first layer with a plurality of electrical components that are arbitrarily or randomly placed on the work piece. Dies are as mentioned above in this text the expression use for any type of component associated with electronics. Typically, each die has connection points where some of them need to be connected between the different dies. A first pattern wherein different zones or sub-areas comprising connection points of dies distributed in the first layer are associated with different requirements on alignment.

Sacred zones and stretch zones are detected in the first pattern. Then the first pattern is transformed such that connection points in adjacent sacred zones are aligned within a predefined and/or presettable alignment deviation parameter. Further, in the transformation, deviations between the positions of corresponding connection points in the sacred zones are compensated for in the patter for connection points of stretch zones. Adjusted pattern data is calculated to realize the transformation and a pattern is written on the layer of the work piece according the adjusted circuit pattern data.

Different embodiments include a method for reconnection of a pattern including a plurality of sacred zones and a plurality of stretch zones corresponding to the sacred zones on a first layer, the method comprising: connecting boundaries of adjacent ones of the sacred zones after individual transformation of the pattern; and compensating, in the stretch zones, for the difference or offset between connection points between the adjacent sacred zones. For example, the compensation is linear. The method may further include providing an additional zone for connection between the first layer and at least one additional layer.

The invention further comprises embodiments of a method for reconnection of a pattern on a workpiece having first, second and third layers formed sequentially on one another, the method comprising: transforming a pattern file for the second layer such that connection points in the first layer are connected to connection points in the third layer. The connection points are in different embodiments vias.

Figure 16A:
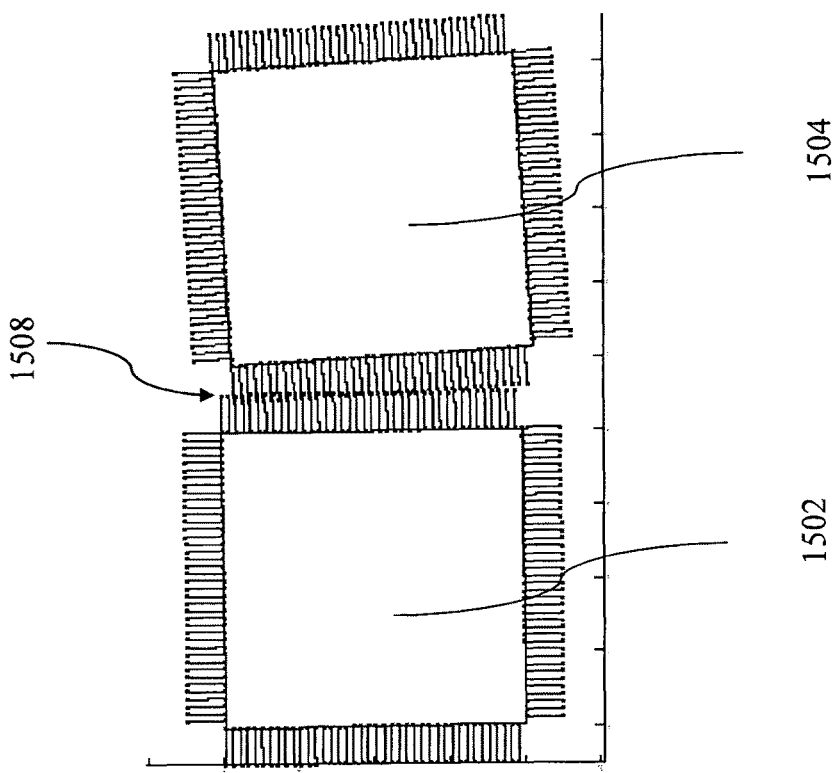
FIG. 16A illustrates a pattern without using the stretch zone concept and in which only individual transformations are applied to the pattern.

In a fan out or similar process (e.g., embedded, etc.), many dies and/or passive components (of one or several types) are placed for example on a carrier wafer or any other applicable workpiece. After the dies have been placed on the carrier wafer, one or more patterning steps are performed on one or more layers of the workpiece. Each die or any other active or passive component has its own unique transformation (e.g., rotation, translation, etc). If the pattern is aligned to each die/component using an LDI machine, differences in individual transformations may create edge roughness, or bad connections for lines that should connect the dies with each other or other layers (e.g., substrate/3D SiP/PCB/workpiece). Accordingly, it may not be possible (or unsuitable) to individually align to each component. As explained in the background section above, FIG. 16A illustrates an example of this problem. More specifically, FIG. 16A illustrates an example after a pattern has been adjusted to the transformation of each chip.

Figure 14:
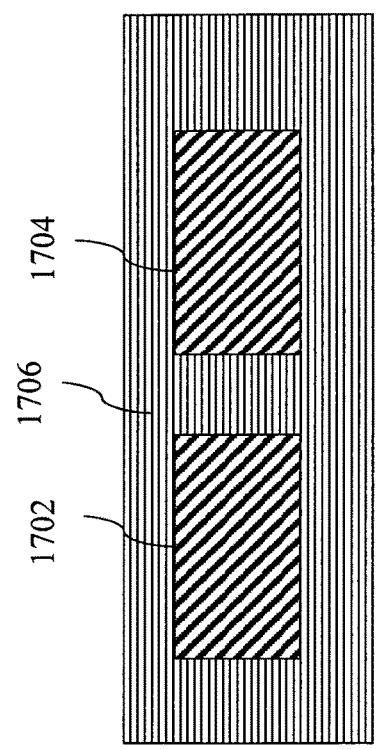
FIG. 14 is an illustration of identified sacred regions and stretch regions.

In accordance with the invention, sensitive regions such as chip areas that need to be relatively well aligned to layers beneath are either marked as sacred regions in the pattern file, i.e. in circuit pattern data, or a well defined algorithm in the machine identifies and locates these regions in the circuit pattern data (e.g., find all or substantially all regions with pads that should connect to vias on the layer beneath). Regions that are not very sensitive with regard to alignment to layers beneath and/or subsequent layers are used as stretch zones as shown in FIG. 14, which is an illustration of identified sacred regions or sub-areas of the workpiece 1702 and 1704 of two dies located within or associated with these sub-areas, and identified stretch regions or sub-areas 1706. In this example the stretch regions are illustrated to be continuously linked, but of course stretch regions may be isolated from each other as well. The terms sacred zone, sacred region, sacred sub-area, and similarly stretch zone, stretch region, stretch sub-area, respectively, are used as alternative expressions.

In a sacred zone, the alignment transformation of the pattern should preferably be best possible or as close to best possible given the transformation of the underlying pattern (or die, component, etc). One solution employed in some embodiments is to connect the boundaries of the sacred zones in the orthogonal coordinate system (and/or in the CAD system) after individual transformation. The difference between these points after the individual alignment is compensated for in the stretch zone. The compensation in this region may be linear as is shown in the figures discussed in more detail further below.

Figure 15:
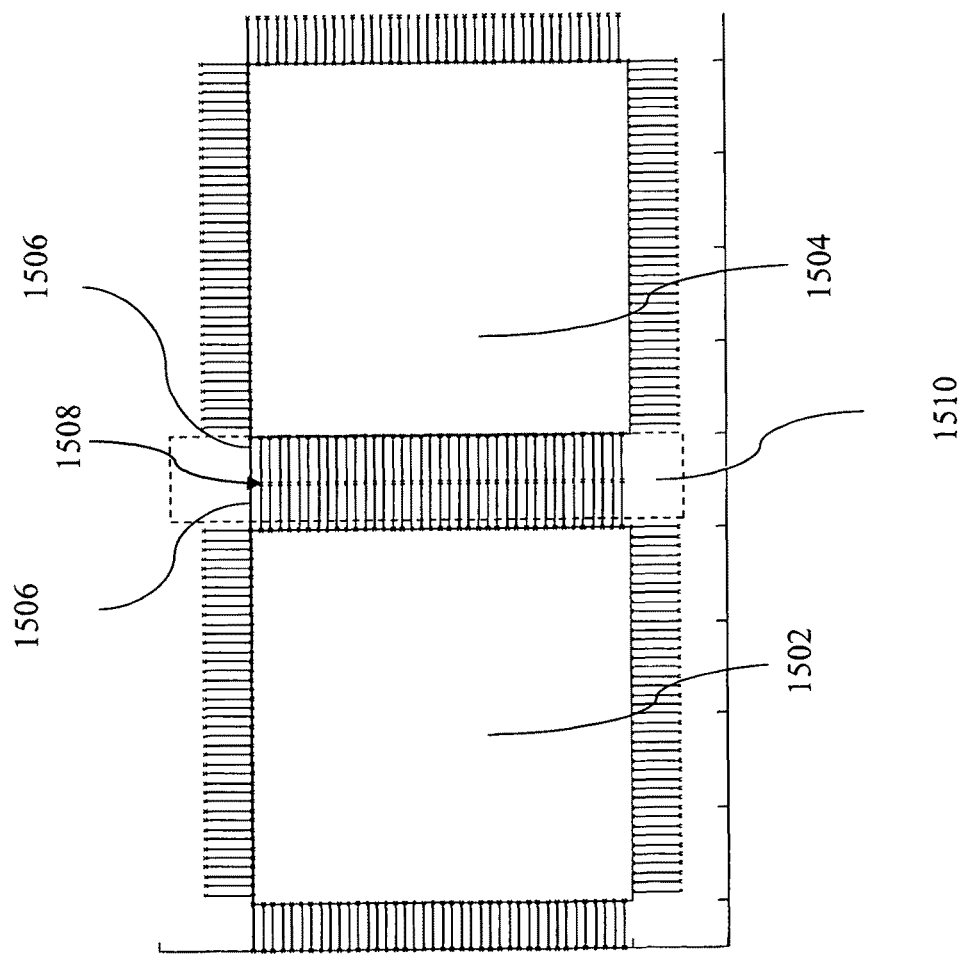
FIG. 15 illustrates another pattern in the CAD domain.

FIG. 15 illustrates example patterns in the design (CAD) domain associated with dies 1502, 1504. In FIG. 15, the shown area of a workpiece is identified or marked as an allowed stretch zone within the intermittently lined sub-area 1510 and the rest of the pattern is a sacred zone.

Figure 16B:
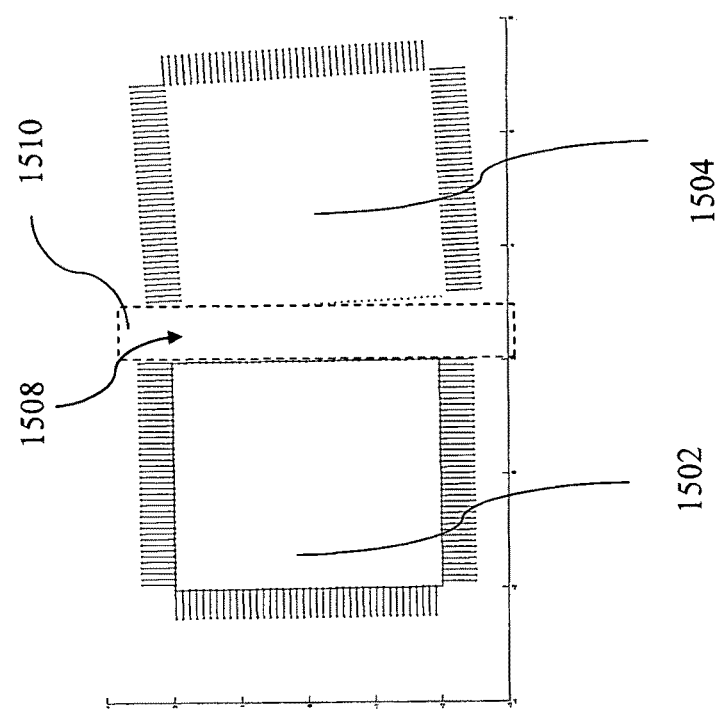
FIG. 16B illustrates an example pattern when the stretch zone concept is used to reconnect regions that are connected in the ideal (original) coordinate system using a linear connection between the sacred zones.

FIG. 16A illustrates a pattern associated with dies 1502, 1504 resulting from a patterning without using the stretch zone concept of the invention, and in which patterning only individual transformation is applied to the pattern. Some of the connection points 1508 are not connected. FIG. 16B illustrates an example pattern associated with dies 1502,1504 where the stretch zone concept is used to reconnect regions that were connected in the ideal (original) coordinate system using a linear connection between the sacred zones. The connection points 1508 are all connected in the stretch zone 1510. The transformation in the stretch zones that connect the sacred zones may also be of other types, for example, a linear combination between the individual transformations or an approximation of these using splines or other fitting methods, for example as described in connection with the previous developments and embodiments of the inventive concept.

Figure 17A:
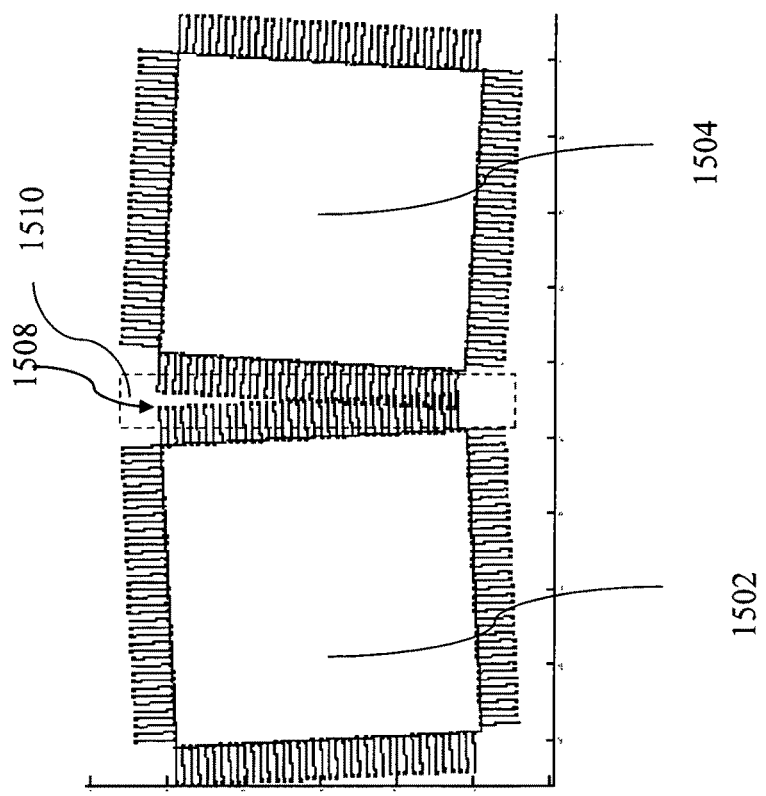
FIG. 17A illustrates an example pattern without using the stretch zone concept and in which only individual transformations are applied to the pattern.
Figure 17B:
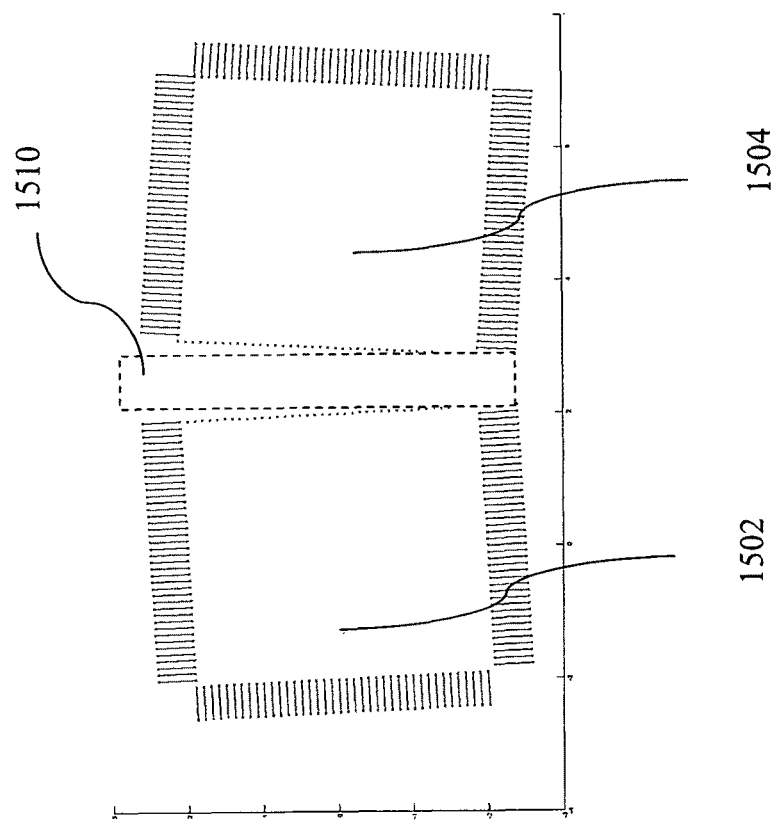
FIG. 17B illustrates an example pattern when the stretch zone is used to reconnect regions that are connected in the ideal (original) coordinate system using a linear combination between the individual transformations.

FIGS. 17A and 17B are illustrations of example patterns associated with dies 1502,1504 where a linear combination between the individual transformations with the boundary condition that the transformation is correct at the boundaries of the sacred zones. More specifically, FIG. 17A illustrates an example pattern without using the stretch zone concept and in which only individual transformations are applied to the pattern. In the example, it is shown that the connection points 1508 are not connected. FIG. 17B illustrates an example pattern if the stretch zone is used for the sub-area 1510 to reconnect regions that were connected in the ideal (original) coordinate system using a linear combination between the individual transformations.

Figure 18:
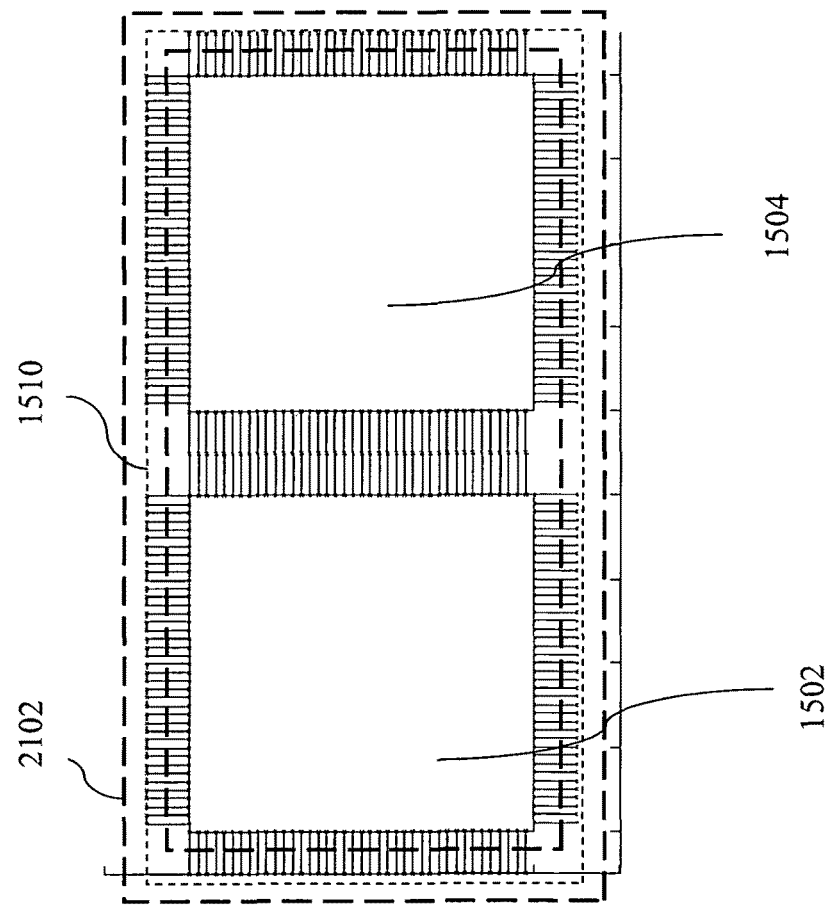
FIG. 18 illustrates an example in which an additional zone has been identified or marked either automatically by the machine or in the pattern file.

An expansion of this example embodiment is to also introduce a third "pattern area type" having the same transformation in order to make several individual transformations to fit to one transformation in the next layer or some layer in-between. FIG. 18 illustrates an example in which an additional zone 2102 has been identified or marked either automatically by the machine or in the pattern data file. The third zone type sub-area 2102 in FIG. 18 is for example intended to be connected to the next layer or to an external component, PCB, etc.

Figure 19A:
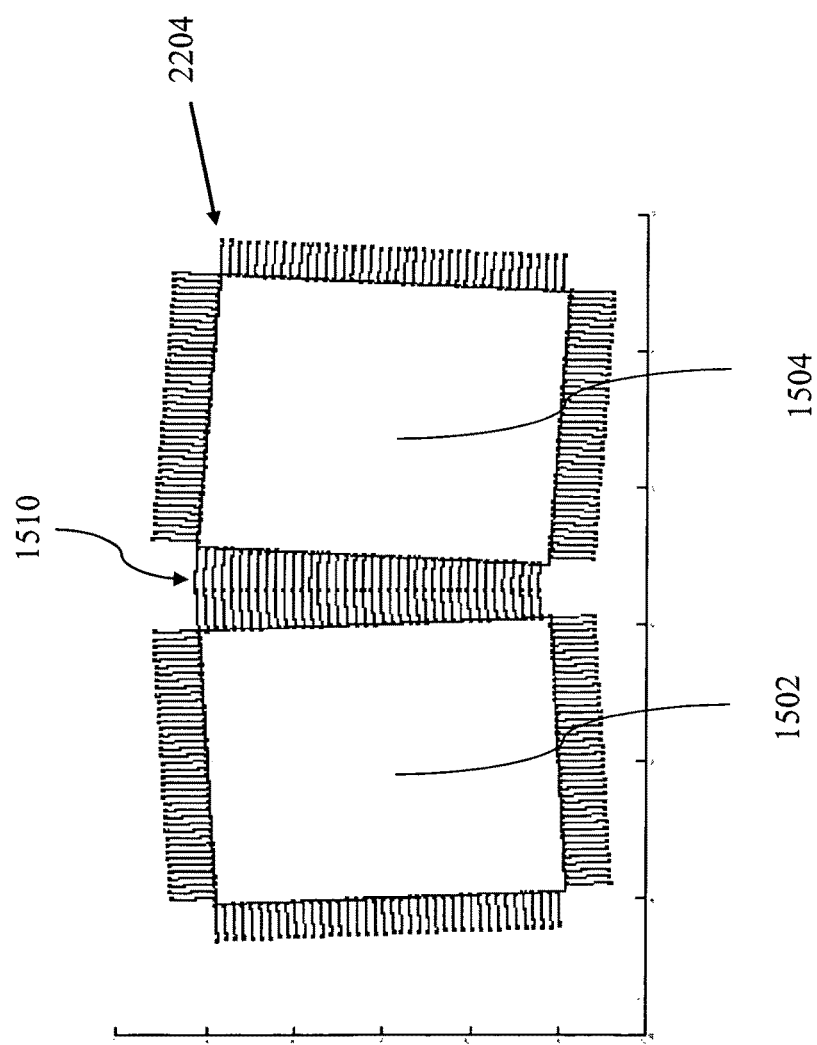
FIG. 19A illustrates an example in which a third zone is not applied.
Figure 19B:
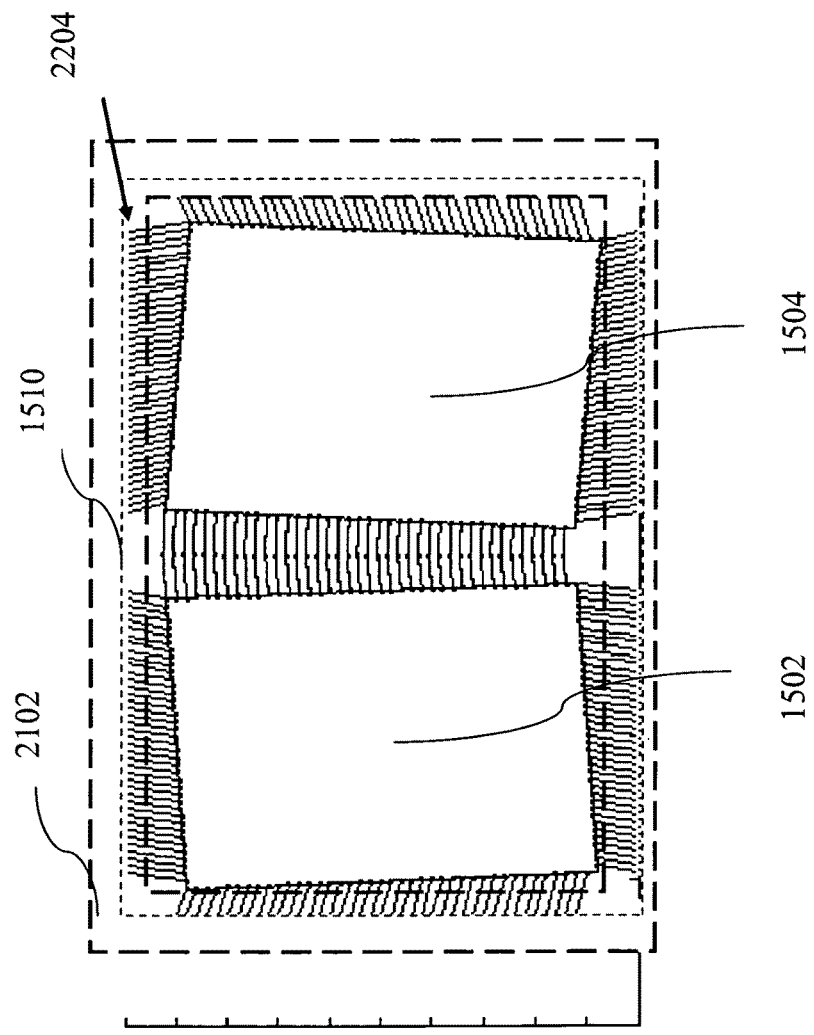
FIG. 19B illustrates an example in which a third zone is applied.

FIG. 19A illustrates an example in which a stretch zone 1510 is used but where a third zone is not applied. FIG. 19B illustrates an example in which a third zone 2102 is applied. As seen in FIGS. 19A and 19B, pattern portions that are associated with dies 1502, 1504 of the workpiece, (for example a chip area), has its transformation. The stretch zone 1510 with the patterns that connect the dies 1502,1504 and the zone in the third area 2200 has a common transformation. The transformation for the third zone 2102 may be chosen arbitrarily (e.g., one of the sacred transformations, linear combination, etc.) or chosen to match a known transformation in the next layer or an external component, PCB, component in carrier wafer, etc.

Example embodiments should not be limited to 3 types of zones. Rather, any number of zones may be used and rules for the transformations and also how the zones are connected may be varied. The reconnection between the zones may be done directly in the vector domain or in the rasterized image using resampling.

An example embodiment including three layers will now be described. In this example, the first layer includes a number of given points. In this example, "given" indicates that the positions of the points have been given or provided by an alignment system and/or additional measurement data from external measurement machine, from a pattern file, etc. The points may be via holes (vias), which may be connected to components like dies for example in the form of active or passive components, but also connected to the edge of a workpiece or to another layer in a workpiece. The workpiece may as exemplified further above be a substrate, PCB, carrier wafer, panel etc., but is not limited to these examples. The position data may be given for each point, for a section or group of points of points, for each die or component, for a section or group of dies or components, etc.

In this example embodiment, there exists a third layer with the same or substantially the same properties as the first layer. For the second layer, which is to be created between the first layer and the third layer, there is a pattern file that connects the points in the first and third layer. However, this is a case where some or all of the points in at least one of the first and third layer may have been misplaced from their original position described in the pattern file. One part of the innovation is to transform the given pattern file for the second layer such that the points in first layer and the third layer are connected and this pattern is printed with a direct write machine on the first or third layer. In one example, this may be done in the following way:

1. Sensitive regions such as points or point areas that need to be relatively well aligned to one or both of the surrounding layers (e.g., one or more of the first and third layers) is marked as a sacred region in the pattern file or a well defined algorithm in the machine may be used to locate these regions (e.g., find all regions with pads that should connect to via/vias on the surrounding layer(s)).
2. Regions that are not very sensitive to aspect on alignment to the surrounding layers and/or subsequent layers are used as stretch zones. In the sacred zone, the alignment transformation of the pattern may be best possible or close to best possible given the transformation of the surrounding patterns.
3. One example solution is to connect the boundaries of the sacred zones in the orthogonal coordinate system (and/or in the CAD system) after individual transformation. The difference between these points after the individual alignment is compensated for in the stretch zone. 4. The compensation in this region may be linear or another type, for example, a linear combination between the individual transformations or an approximation of these using splines or other fitting methods.

Example embodiments should not be limited to a certain number of points/zones. Rather, an arbitrary number of points/zones are allowed, and the rules for the transformations and how they should be connected may be varied. The reconnection between the points/zones may be done directly in the vector domain or in the rasterized image using resampling.

Figure 20A:
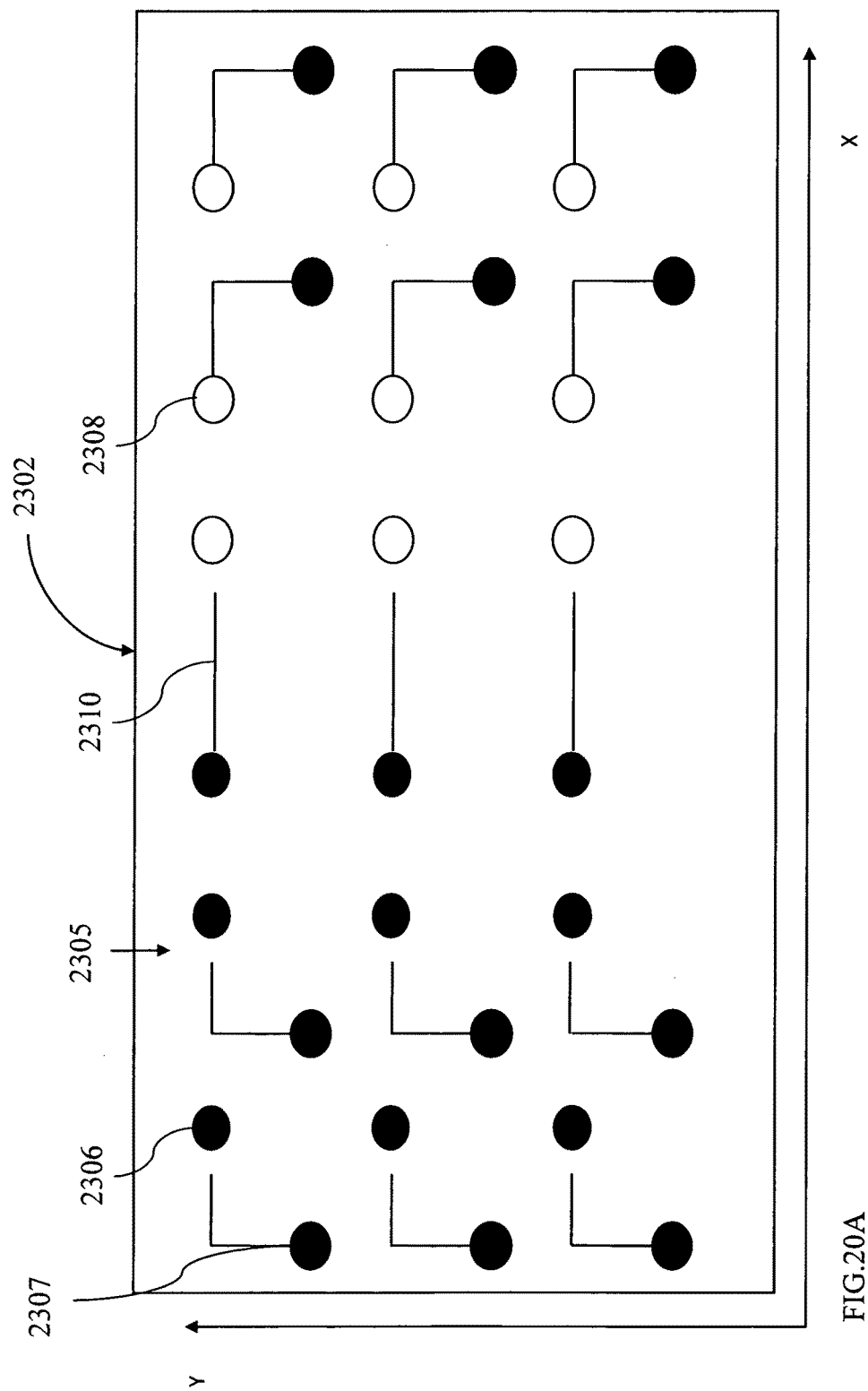
FIG. 20A shows an example printed pattern without compensation.

In the example shown in FIG. 20A, two dies for example chips have both connections to each other and a common connection to a next layer in a workpiece (for example PCB/substrate/workpiece). Black dots 2306 represent sacred regions for a first die, for example a chip or component on a workpiece 2302, (where the sacred regions for example comprises connections to a via. White dots 2308 represent sacred regions for a second die. The grey dots 2307 are sacred regions for connections to a next, subsequent layer of the workpiece. The regions in-between the dots marked as black lines are stretch zones 2310.

In this example, the first die on the workpiece has a translation of about 20 μm in the X-direction and about −20 μm in the Y-direction. The rotation is about −10 mrad. The second die has a translation of about −24 μm in the X-direction and about −20 μm in the Y-direction. The rotation is about 10 mrad. The transformation data may be obtained from a separate measurement performed in or outside the machine or in connection with the actual writing. The transformation of the grey dots 2304 have, in this case, all been set to 0. If no pattern healing or reconnection is performed in the stretch zone, the lines (connectors) do not meet the boundary condition at the edge of all sacred zones.

Broken lines 2305 or connectors may occur in printed patterns without compensation. If example embodiments are applied and the difference or part of the difference in the transformations in the stretch zone is taken care of, the broken line or connector phenomena may be improved and even be removed.

Figures 21A, 21B:
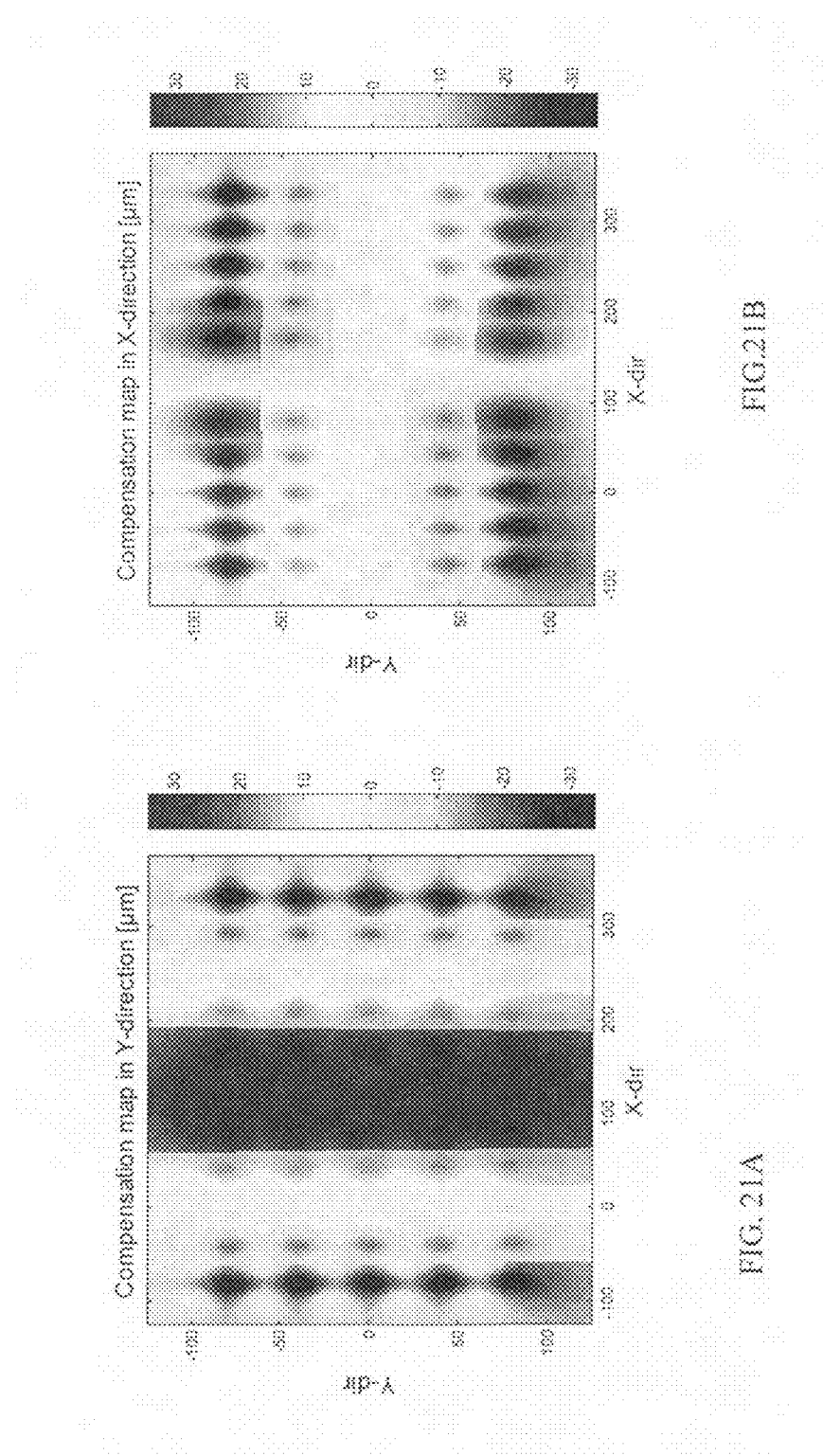
FIG. 21A-21B show example transformation maps.

Example transformation maps to be used in a compensated pattern are shown in FIG. 21A-B. The transformation maps may be calculated as soon as the relative measurement data of the dies/components are determined. The global workpiece transformation is then a global transformation of this map.

Figure 22A:
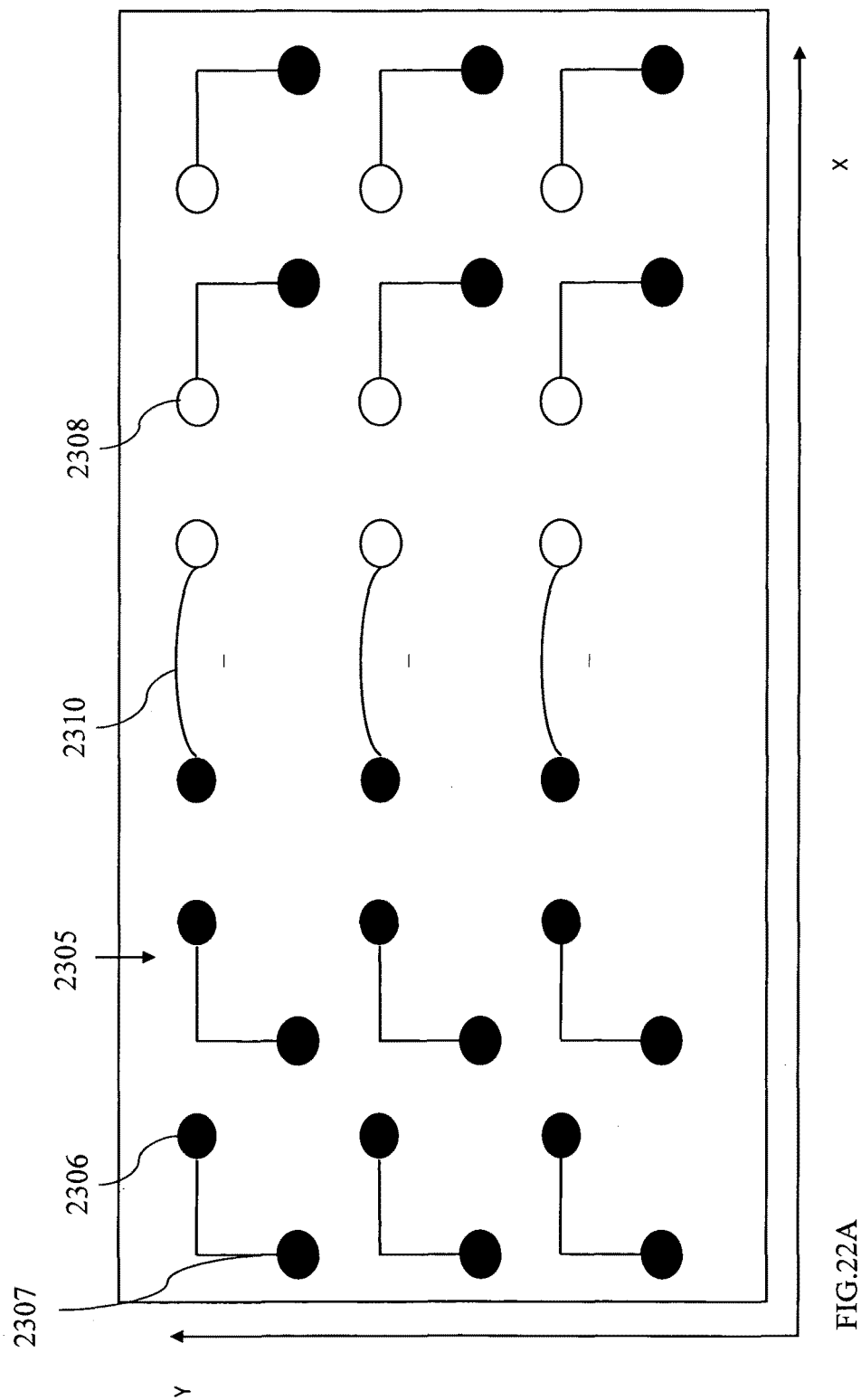
FIG. 22A shows an example printed pattern with compensation.

FIG. 22A shows an example printed pattern with compensation As seen in FIG. 22A, the sacred zones 2308 has the correct transformations and the connectors (pattern) 2010 between the sacred zones have been stretched to support the boundary conditions.

This example approach may alter the length of the connectors by a relatively small amount. It is possible to compensate for this alteration by performing corrections in pattern data in the vector domain or by applying a filter in the rasterized domain, for example if a buffer is provided.

Figure 22B:
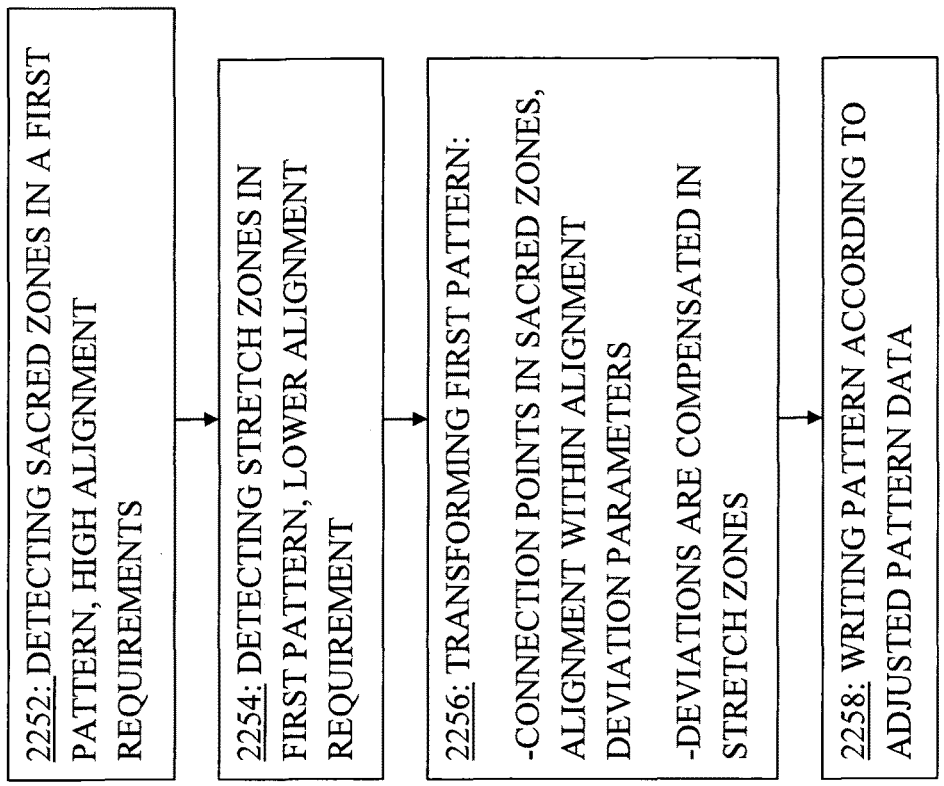
FIG. 22B shows a flow chart of a method employing the sacred zone concept according to an embodiment of the invention.

A preferred embodiment of the method, which is schematically shown in the flow chart of FIG. 22B, comprises the steps of:

2252: Detecting sacred zones in first pattern that have a high requirement on alignment to selected features of the system-in-package stack or to the placed components.

The sacred zone is in one embodiment detected by a preset marking in the original circuit pattern data, or as in another embodiment detected by a recognition algorithm devised for recognizing a sacred zone in the original circuit pattern data according to predefined rules. An example of such a predefined rule is that the occurrence of a certain recognizable feature, for example a connection point, a via or a contact pad, indicates a sacred zone.

2254: Detecting stretch zones of the first pattern that are allowed to have a lower requirement on alignment to other features of the system-in-package stack.

2256: Transforming the first pattern by calculating adjusted first pattern data comprising transformation of the original circuit pattern such that:

i. connection points in adjacent sacred zones are aligned within a pre-settable alignment deviation parameter; and such that ii. deviations between the positions of corresponding connection points in the sacred zones are compensated for in the pattern for connection points of the stretch zones.

The transformation for the circuit pattern in the sacred zone is in one embodiment such that connection points in adjacent sacred zones are connected also after individual transformation.

2258: Then writing a pattern on the layer of the work piece according to the adjusted pattern data.

A further developed embodiment includes the notion of an additional third zone type. Such as development further comprises:

a. Detecting an additional zone type of the circuit patterns of the dies that comprises connection points for connection between a first layer and at least one second layer;

b. Calculating adjusted circuit pattern data using a selected transformation for circuit patterns of the additional zone type.

The same transformation types as for the sacred zones or stretch zones may be used for circuit patterns of the additional zone type.

Different transformations may be used, for example any of the transformations described above for different developments of the inventive concept. For example, the transformation for alignment in the sacred zone is a selection of linear or non-linear transformation. Similarly, the transformation for compensation in the stretch zone is a selection of linear or non-linear transformation.

There are different alternatives for preparing an adjusted circuit pattern. For example, the adjusted circuit pattern is prepared by transformation of the circuit pattern data in a vector domain or in a rasterized image.

In some embodiments of the sacred zone/stretch zone-concept that are implemented in alignment of a pattern to dies or features between different layers, stretch zones may be applied to even out the difference between separate sacred zones that are created for connections through layers downwards or upwards in a stack of layers.

The different variations of this development of the inventive concept may also be simultaneously matched to a second pattern. Such embodiments are advantageously combined such that a first circuit pattern data is adjusted to fit connection points or contact pads of a first die (or component) to connection points or contact pads of a second die (or component), and to a second pattern simultaneously. In short, the methods of any of the preceding embodiments, may thus also comprise that the first pattern is transformed to an adjusted first pattern data also aligning to features of a second pattern in a preceding or succeeding layer.

Determining the Coordinate System and Performing Alignment with Reference Board

The coordinate system in a write machine, such as direct writer in an LDI system, can be determined in different manners, for example by detecting a reference scale or a reference board; or by structural mechanisms such as the positions of cameras, the positions being considered to be fixed; or by using light measurements such as interferometrics.

In an example embodiment the determining of the coordinate system of a write machine is carried out by means of a reference board in the following setup. The reference board is applied in a writing system and an alignment system comprising a measurement station and a reference board mounted on a workpiece carrier stage. The alignment system thus includes a measurement station with a camera bridge on which, in this example, a plurality of camera systems are mounted, and a reference board mounted on each of a plurality of workpiece carrier stages. There may be one or a plurality of cameras comprised in the measurement station. The carrier stages move between measurement station of the alignment system and the writing system. A computer is operatively and/or communicatively coupled to the measurement station of the alignment system and the writer system. In operation, typically a plurality of carrier stages are used to carry separate workpieces for patterning. The carrier stages are typically displaceable on a carrier stage track between a measurement position in the measurement station and a writing station in the writer.

A reference board is attached to each carrier stage. The reference board may for example be composed of a temperature stable material such as QZ (quartz). The reference board carries information between the measurement station coordinate system of the alignment system and the writer coordinate system.

The reference board is preferably attached to the carrier stage in such a manner that the reference board is fixed to the carrier stage. For example, as in one embodiment, the reference board is fastened or joined to the carrier stage by bolts or screws. Preferably, a joint would be arranged in combination with a flexural joint mechanism to compensate for tensions for example due to temperature changes. In another embodiment, the reference board is glued to carrier stage.

Reference features, for example in the form of a grid pattern are provided on the reference board. The reference features may comprise marks constituting board reference features including circles in the form of filled circles and annular ring shaped circles. The positions of the marks are either known from a sufficiently accurate measurement machine or written by equipment such that the marks are assumed to be ideal. In one example application of the invention, the positions of the marks are measured, and the measured positions of the marks are compared to nominal positions to create a compensation map. The compensation map addresses the residual error and is used in the alignment process to create an adjusted pattern.

In a more general sense, the reference board is implemented for associating the reference features with the carrier stage by integrating the reference features directly with the carrier stage. This is inter alia used in a method for calibrating the alignment system.

The reference board can be used to determine the coordinate system of a write machine in an alignment process. Such an alignment process described in a general wording is typically applied in a setting wherein a pattern generating tool according comprises a reference board attached or fixed to a stage, the reference board being configured to carry alignment information between the alignment system and a writing tool. One or more cameras are mounted on a camera bridge, and the one or more cameras are configured to measure positions of alignment marks on a substrate relative to the reference board, the substrate being attached or fixed to the stage. A writing system is configured to expose the substrate. A computer is operatively coupled to the alignment system and writer system.

The method comprises the steps of providing a reference board attached to the carrier stage, the reference board having board reference features on predetermined nominal positions; measuring at least once, in the measurement station, the position, e.g. location and orientation, of at least one of the reference features of the workpiece relative the reference board; displacing the carrier stage with the reference board from the measurement station to the writing station; calibrating the writing station by measuring the position of the reference board using at least one of the board reference features of the reference board.

Further, the embodiments of the method comprise a selection of optional calibration steps. Firstly, the method may include the step of calibrating the writing station by measuring the position of the reference board using at least one of the board reference features of the reference board.

Secondly, the method may include the step of calibrating the measurement station to the reference board by measuring, in the measurement station, at least one of the board reference features of the reference board.

The calibrating of the measurement station comprises, in one variation the steps of:
determining the scale error and distortion for each camera in the measurement station by measuring the positions of board reference features arranged in a uniform or non uniform grid pattern on the reference board and comparing with nominal positions of the board reference features;
calculating a lens distortion map dependent on the measured scale error distortions of the cameras; the map can hold only the non linear scale errors/distortions or also the global linear scale error.
calculating the landing angle of the camera by measuring position of reference boards at different height; determining the position of each camera in the measurement station relative the reference board by: detecting the position of board reference features on the reference board; calculating the position of each camera dependent on a predetermined relationship between the position of the board reference features and a reference point on the reference board; calculating the rotation of each camera as the rotation between the pattern and the coordinate system associated with the camera.

The calibration of the write machine and optionally also the measurement system is thus advantageously used for determining the coordinate system of the write machine.

When patterning and aligning according to various embodiments as described above, this may be carried out using a reference board according to the following method:

A method of patterning a layer of a workpiece in a write machine, where the write machine comprises:
a pattern writing station provided with a write machine coordinate system; and
a measurement station provided with a measurement coordinate system, the measurement station being configured to perform measurements of objects on a workpiece associated with reference features, where the workpiece is further placed on a carrier stage and where the write machine is configured to displace the carrier stage between the measurement station and the writing station;

the method comprising the steps of:
a. providing a reference board attached to the carrier stage, the reference board having board reference features on predetermined nominal positions;
b. measuring at least once, in the measurement station, the position, e.g. location and orientation, of at least one of the reference features of the workpiece relative the reference board;
c. calculating a transformation dependent on both the measured reference position(s) and on the nominal position(s) of the reference feature(s) of the workpiece, the transformation describing the deviation of the measured positions from the nominal position(s);
d. displacing the carrier stage with the reference board from the measurement station to the writing station;
e. writing the pattern on the workpiece by adjusting for the transformation describing the deviation of the measured position(s) from the nominal position(s).

The alignment method may further include the step of calculating a transformation comprises:
the action of calculating adjusted pattern data according to the transformation, and
fitting the adjusted pattern data to the position of the workpiece being given relative the position of the reference board;
and wherein:
the step of writing the pattern on the workpiece is performed by exposing the work piece according to the adjusted pattern data.
Further embodiments are deloped wherein:
the calculation of the adjusted pattern data for writing on the work piece is dependent on measured positions of the reference features of the work piece relative a board reference feature of the reference board, and wherein the reference board represents the coordinate system of the carrier stage by having a attached relative distance to the carrier stage.
The method further comprising the step of calibrating the writing station by measuring the position of the reference board using at least one of the board reference features of the reference board.
The method further comprising the step of calibrating the measurement station to the reference board by measuring, in the measurement station, at least one of the board reference features of the reference board.
A carrier stage for use in a write machine configured for patterning of a layer of a workpiece, wherein reference features are associated with the carrier stage, the reference features having predetermined nominal positions.

The carrier stage for this purpose comprises a reference board is attached to the carrier stage, the reference board having board reference features on predetermined nominal positions. The reference features and/or the reference board is configured with an orientation on the carrier stage: —orthogonally in relation to the main movement direction of the reference board; and/or —coaxially in relation to the main movement direction of the reference board. The reference features and/or the reference board may for example be configured: in an elongate shape; —in an L-shape, and wherein the reference board for example is attached to the carrier stage by: —a screw or bolt joint; —a glue joint.

The invention claimed is:

1. A method for patterning a second layer of a workpiece in a direct write machine in the manufacturing of a multilayer stack, the workpiece having a first layer with a plurality of electrical components in the form of dies that are arbitrarily placed, each die having connection points whereof some are to be connected between the dies, a selection of said dies being associated with a first pattern wherein different zones comprising connection points of dies placed in the first layer are associated with different requirements on alignment;

the method comprising the steps of:
   a. detecting sacred zones in the first pattern that have a high requirement on alignment to selected features of the stack or to the placed dies;
   b. detecting stretch zones of the first pattern that are allowed to have a lower requirement on alignment to other features of the stack;
   c. transforming the first pattern by calculating adjusted first pattern data comprising transformation of the original circuit pattern such that:
      i. connection points in adjacent sacred zones are aligned within a pre-settable alignment deviation parameter; and such that
      ii. deviations between the positions of corresponding connection points in the sacred zones are compensated for in the pattern for connection points of the stretch zones;
   d. writing a pattern on a second layer of the workpiece according to the adjusted first pattern data.

2. The method of claim 1, wherein the sacred zone is detected by:
   a preset marking in the original circuit pattern data or
   a recognition algorithm devised for recognizing a sacred zone in the original circuit pattern data according to predefined rules.

3. The method of claim 1, wherein the transformation for the circuit pattern in the sacred zone is such that connection points in adjacent sacred zones are connected also after individual transformation.

4. The method of claim 1 further comprising:
   a. Detecting an additional zone type of the circuit patterns of the dies that comprises connection points for connection between a first layer and at least one second layer;
   b. Calculating adjusted circuit pattern data using a selected transformation for circuit patterns of the additional zone type.

5. The method of claim 4, wherein the same transformation is used for circuit patterns of the additional zone type.

6. The method of claim 1; wherein the transformation for alignment in the sacred zone is a selection of linear or non-linear transformation.

7. The method of claim 1, wherein the transformation for compensation in the stretch zone is a selection of linear or non-linear transformation.

8. The method of claim 1, wherein an adjusted circuit pattern is prepared by re-sampling of circuit pattern data in a vector domain or in a rasterized image.

9. The method of claim 1, wherein the first pattern is transformed to an adjusted first pattern data also aligning to features of a second pattern in a preceding or succeeding layer.

10. The method of claim 1, wherein the first pattern is simultaneously matched to a second pattern.

11. The method of claim 1, wherein the first pattern is also matched to a second pattern;

the method further comprising the steps of:
   a. retrieving first circuit pattern data of a first circuit pattern representing at least one first sub-area of said first layer of the workpiece, wherein the at least one first sub-area is associated with, and is covering, at least one die of the plurality of dies of the first layer;
   b. retrieving second circuit pattern data of a second circuit pattern representing at least a second sub-area associated with a plurality of connection points of one or a plurality of specific features of a second layer(s), wherein the second layer(s) is one or a plurality of preceding or succeeding layer(s) of the workpiece and/or one or a plurality of layer(s) in a second workpiece that is to be connected to the workpiece, and wherein at least one of the plurality of connection points of the at least one die of the first layer is adapted for connecting to at least one of the connection points of the one or plurality of specific features of the second layer(s);
   c. determining required first fitting tolerance(s) for adjusting the first circuit pattern at least to the first sub-area of the first layer;
   d. determining required second fitting tolerance(s) for adjusting the first circuit pattern so that the connection points of the adjusted first circuit pattern fit to the connection points of at least one second circuit pattern representing the one or plurality of specific features of the second layer(s);
   e. preparing adjusted first circuit pattern data that fit the adjusted first circuit pattern to
      i. the at least one first sub-area of the first layer within the required first fitting tolerances; and
      ii. the at least one of the connection points of the at least one die of the first circuit pattern representing the at least one first sub-area to the at least one of the connection points of the one or plurality of specific features of the at least one second circuit pattern within the second fitting tolerance(s);
   f. writing a pattern on the workpiece according to the adjusted first circuit pattern data.

12. The method of claim 11, wherein the adjusted first circuit pattern data is prepared by transforming connection point patterns of the first pattern data to adjusted connection point patterns having positions and surface areas covering the required second fitting tolerance(s).

13. The method of claim 12, wherein the position of an adjusted connection point pattern is the nominal position of the connection point pattern in the original circuit pattern data of the first circuit pattern.

14. The method of claim 13, wherein the adjusted connection point patterns each have a position and surface area within which all points have a distance less than the required fitting tolerance(s) from the ideal position.

15. The method of claim 11, further including the step of first determining required fitting tolerances for adjusted connection points to fit to the connection points of the dies in the first circuit pattern.

16. The method of claim 11, wherein the second layer(s) has been previously formed or is to be subsequently formed on the same workpiece or on/for the second workpiece that is to be joined to the workpiece in the stack.

17. The method of claim 15, wherein the required fitting tolerance(s) is determined as a position and/or a surface area covering a projection of the connection point of the first circuit pattern and a projection of the connection point of the at least one second circuit pattern when the patterns are aligned.

18. The method of claim 15, wherein the required fitting tolerance is determined by transforming said patterns and said layers to a common plane, and calculating the required fitting tolerance based on distances between ideal pattern data and adjusted pattern data in said common plane.

19. The method of claim 15, wherein the required fitting tolerance(s) is a distance of less than 50 μm from the ideal position.

20. The method of claim 15, wherein the required fitting tolerance(s) is a distance less than 5-8 μm from the ideal position.

21. The method of claim 15, wherein the required fitting tolerance(s) is a distance less than 1 μm from the ideal position.

22. The method of claim 11, wherein the at least one second circuit pattern data is a subset of the first circuit pattern data.

23. The method of claim 11, wherein the at least one second circuit pattern is representing a completely separate area from the area represented by the first circuit pattern.

24. The method of claim 11, wherein a sub-portion of the first circuit pattern is representing a sub-area of the total area represented by the at least one second circuit pattern.

25. The method of claim 11, wherein the preparing of the adjusted first circuit pattern data comprises:
  c. rendering the first circuit pattern data from a set of ideal pattern data; then
  d. re-sampling the first circuit pattern data in order to fit the adjusted first circuit pattern to
    i. the at least one first sub-area of the first layer within the required first fitting tolerances; and
    ii. the at least one of the connection points of the at least one die of the first circuit pattern representing the at least one first sub-area to the at least one of the connection points of the one or plurality of dies of the at least one second circuit pattern within the second fitting tolerance(s); or
  e. re-sampling the first circuit pattern data in order to fit the adjusted first circuit pattern data to the at least one first sub-area of the first layer, wherein the first circuit pattern data is re-sampled independently of the re-sampling of the at least one second circuit pattern data; and merging the re-sampled first circuit pattern data with the at least one re-sampled second circuit pattern data in order to produce a re-sampled third circuit pattern data representing both the adjusted first circuit pattern and an adjusted at least one second circuit pattern within the first and the second fitting tolerances.

26. The method of claim 11, wherein the retrieving of first circuit data of the first circuit pattern is comprising the steps of:
  a. receiving measurement data being associated with the workpiece and indicating a measured position of a plurality of the dies, or group of dies, placed on the workpiece in relation to at least one reference feature of the workpiece;
  b. detecting the at least one reference feature of the workpiece;
  c. determining the relation between the at least one reference feature of the workpiece and the coordinate system of the direct write machine.

27. The method of claim 26, further comprising the steps of:
  d. transforming the measured position of the plurality of dies, or group of dies, placed on the workpiece to a transformed position defined in the coordinate system of the direct write machine dependent on the determined relation between the at least one reference feature of the workpiece and the coordinate system of the direct write machine;
  e. preparing the adjusted first circuit pattern data for writing on the workpiece dependent on the original pattern data and the transformed positions, wherein the adjusted first circuit pattern data represents the circuit pattern of the plurality of dies on the workpiece, such that the adjusted first circuit pattern is fitted to a plurality of sub-areas of the workpiece area, and wherein each sub-area is associated with a die, or group of dies, among the plurality of dies placed on the workpiece.

28. The method of claim 11, wherein the preparing of the adjusted first circuit pattern data comprises:
  f. rendering the first circuit pattern data from a set of ideal pattern data; then
  g. re-sampling the first circuit pattern data dependent on the measured position data of the at least one die(s) and on the transformed position and shape of the workpiece in order to fit data to each die on the workpiece in the coordinate system of the direct write machine; or
  h. re-sampling the first pattern data dependent on measured position data of a group or a cluster of the plurality of dies and on the transformed position and shape of the workpiece in order to fit data representing the associated with the plurality of on the workpiece in the coordinate system of the direct write machine.

29. The method of claim 11, wherein the second layer(s) has been previously formed or is to be subsequently formed on the workpiece.

30. The method of claim 11, wherein at least one of the second layer(s) is on/for the second workpiece that is to be joined in the stack.

31. The method of claim 11, wherein the required fitting tolerance is determined as a position and/or a surface area covering a projection of the connection point of the first circuit pattern and a projection of the connection point of the second circuit pattern when the patterns are aligned.

32. The method of claim 11, wherein required fitting tolerance for adjusted connection points is determined by transforming said patterns and said layers to a common plane, and calculating the required fitting tolerance based on distances between ideal pattern data and adjusted pattern data in said common plane.

33. The method of claim 11, wherein the adjusted first circuit pattern data is rendered to be fitted to the plurality of dies, or group of dies, in a way such that the sub-portions of the adjusted first pattern data each represents a sub-area of the workpiece associated with a particular die, or group of dies, and where each of said sub-areas includes, or covers, said particular die, or group of dies.

34. The method of claim 11, wherein at least a portion of the workpiece area is divided into sub-areas that each are to be represented by sub-portions of the adjusted first pattern data, and wherein the sub-areas are identified by the received measurement data and/or the workpiece area is divided into sub-areas by the use of a pre-determined algorithm.

35. The method of claim 34, wherein the sub-areas are automatically identified by the received measurement data and/or the workpiece area is automatically divided into sub-areas by the use of the pre-determined algorithm.

36. The method of claim 34, wherein a plurality of said sub-portions of the adjusted first circuit pattern data are rendered to fit to respective sub-area within certain requirements or pre-settable deviation parameters.

37. The method of claim 36, wherein the certain requirement or pre-settable deviation parameters are associated with at least one of:
   a. type of die, component, or group of dies/components; or
   b. a characteristic of the surface structure of the die(s)/component(s); or
   c. a characteristic of the shape of the die(s)/component(s), such as an edge or a corner of the die(s)/component(s).

38. The method of claim 11, wherein the whole adjusted first circuit pattern data is fitted to the plurality of dies, or group of dies, on the workpiece within a pre-settable deviation parameter or set of deviation parameters.

39. The method of claim 38, wherein the pre-settable deviation parameters include both parameter(s) associated with location and parameter(s) associated with orientation.

40. The method of claim 11, wherein the adjusted first circuit pattern data associated with a particular die, or group of dies, is fitted individually to said particular die, or group of dies.

41. The method of claim 11, wherein the plurality of dies, or group of dies, includes all of the dies placed on the workpiece.

42. The method of claim 11, wherein the circuit pattern data associated with at least one of the dies, or group of dies, on the workpiece is adjusted individually and independently of circuit pattern data associated with the other dies on the workpiece.

43. The method of claim 11, wherein the circuit pattern data associated with each of the dies, or group of dies, on the workpiece is adjusted individually and independently of circuit pattern data associated with any of the other dies on the workpiece.

44. The method of claim 11, wherein the positions of the dies, or group of dies, in terms of both location and orientation together with the workpiece location and orientation relative the writer coordinate system is used to determine a transformation of the measured positions defined in the coordinate system of the direct write machine.

45. The method of claim 11, wherein the position of the dies, or group of dies, is determined in terms of:
   the location and the orientation of the dies on the workpiece in relation to at least one of the reference;
   and/or
   the spatial location and orientation of the dies, or group of dies, in a space comprising the workpiece in relation to the reference.

46. The method of claim 11, where the adjusted circuit pattern data represents the whole workpiece having all of the dies placed thereon.

47. The method of claim 11, wherein the at least one reference feature of the workpiece is determined by a selection of:
   a. one or several alignment mark(s) provided on the workpiece; or
   b. one or several reference feature(s) provided on one or a plurality of reference die(s) selected among the plurality of dies; or
   c. a characteristic of the arrangement of the dies placed on the workpiece; or
   d. a characteristic of the surface structure of the workpiece; or
   e. a characteristic of the surface structure of the die(s); or
   f. one or several reference die(s); or
   g. a characteristic of the shape of the workpiece, such as an edge or a corner of the workpiece.

48. The method of claim 11, wherein a reference feature of a die is determined by a selection of:
   a. one or several alignment mark(s) provided on the die; or
   b. a characteristic of the surface structure of the die(s); or
   c. a characteristic of the shape of the die, such as an edge or a corner of the die.

49. The method of claim 11, wherein measuring of the position of a die is determined by a selection of:
   a. determining the spatial position of the die in relation to the reference feature by means of a selection of a shape based position determining algorithm, an edge detection based algorithm, a correlation based algorithm or another image analysis techniques devised for extracting a position from a reference feature; or
   b. determining the spatial position of the die in relation to the reference feature with one or several alignment mark(s) on the die; or
   c. determining the spatial position of the die in relation to the reference feature by a characteristic of the surface structure of the die 50. The method of claim 11, wherein the preparing of adjusted circuit pattern data comprises:
   i. rendering the original pattern data from a set of ideal pattern data; then
   j. re-sampling the original pattern data dependent on the measured position data of the die(s) and on the transformed position and shape of the workpiece in order to fit data to each die on the workpiece in the coordinate system of the direct write machine; or
   k. re-sampling the original pattern data dependent on measured position data of a group or a clusters of the dies and on the transformed position and shape of the workpiece in order to fit data to each group or cluster on the workpiece in the coordinate system of the direct write machine.

51. The method of claim 1, wherein the preparing of adjusted circuit pattern data comprises:
   transforming the original pattern data in the form of vector data to fit each die, or group of dies, and rasterizing said transformed vector data.

52. The method of claim 1, wherein the preparing of adjusted circuit pattern data comprises:
   transforming the original pattern data in the form of vector data to fit each die, or group of dies, and rasterizing said transformed vector data such that the rasterized vector data represents the whole workpiece having all of the dies placed thereon.

53. The method of claim 1, where a die is a passive component, an active component, or any other component associated with electronics.

54. The method of claim 1, wherein measurement data indicating the position of the dies or of a group/cluster of dies on the workpiece is determined:
   a. in a separate measurement machine; or
   b. in a measurement arrangement that is integrated with or integrated in the direct write machine.

55. The method of claim 1, wherein the steps b-e are performed in a sequence, thereby enabling measurement and writing in real time.

56. The method of claim 1, wherein the preparing of adjusted circuit pattern data is based solely on measurements and data associated with the workpiece, thereby enabling measurement and writing time in real time.

57. The method of claim 53, wherein the transformation of the pattern data, vector data or coordinate system to fit the spatial positions of the die(s) or groups/clusters of dies could be either linear or non-linear.

58. The method of claim 11, wherein the preparing of adjusted circuit pattern data comprises transforming of the pattern data to fit the positions of the dies, or group of dies, using a selection of linear or non-linear transformations.

59. The method of claim 1, wherein transforming measured positions to transformed positions of the dies, or group of dies, comprises a selection of linear or non-linear transformations.

60. An apparatus for patterning a second layer of a workpiece in a direct write machine in the manufacturing of a multilayer stack, the workpiece having a first layer with a plurality of electrical components in the form of dies that are arbitrarily placed, each die having connection points whereof some are to be connected between the dies, a selection of said dies being associated with a first pattern wherein different zones comprising connection points of dies placed in the first layer are associated with different requirements on alignment;

where the direct write machine is provided with a coordinate system for controlling write operations the apparatus comprising a computer system configured to:
a. detecting sacred zones in the first pattern that have a high requirement on alignment to selected features of the stack or to the placed dies;
b. detecting stretch zones of the first pattern that are allowed to have a lower requirement on alignment to other features of the stack;
c. transforming the first pattern by calculating adjusted first pattern data comprising transformation of the original circuit pattern such that:
   i. connection points in adjacent sacred zones are aligned within a pre-settable alignment deviation parameter; and such that
   ii. deviations between the positions of corresponding connection points in the sacred zones are compensated for in the pattern for connection points of the stretch zones; and
d. a writing tool control unit configured to control a writing tool to writing a pattern on a second layer of the workpiece according to the adjusted first pattern data.

61. The apparatus of claim 60, further comprising functional units and/or mechanisms configured to perform the steps and/or functions of the method according to claim 1.

62. A computer program product for patterning a layer of a workpiece in a direct write machine in the manufacturing of a multilayer stack, where the direct write machine is provided with a coordinate system for controlling write operations on a first layer of the workpiece having a plurality of electrical components in the form of dies that are arbitrarily placed, each die having connection points whereof some are to be connected between the dies, a selection of said dies being associated with a first pattern wherein different zones comprising connection points of dies placed in the first layer are associated with different requirements on alignment;

the computer program product comprising computer program code portions configured to control a computer system to perform the steps of:
a. detecting sacred zones in the first pattern that have a high requirement on alignment to selected features of the stack or to the placed dies;
b. detecting stretch zones of the first pattern that are allowed to have a lower requirement on alignment to other features of the stack;
c. transforming the first pattern by calculating adjusted first pattern data comprising transformation of the original circuit pattern such that:
   i. connection points in adjacent sacred zones are aligned within a pre-settable alignment deviation parameter; and such that
   ii. deviations between the positions of corresponding connection points in the sacred zones are compensated for in the pattern for connection points of the stretch zones; and
d. controlling a writing tool to writing a pattern on a second layer of the workpiece according to the adjusted first pattern data.

63. The computer program product of claim 62, further comprising computer program code portions configured to control a computer system to perform the steps and/or functions of the method according to claim 1.

* * * * *